United States Patent
Ranjan et al.

(10) Patent No.: US 8,711,613 B2
(45) Date of Patent: *Apr. 29, 2014

(54) NON-VOLATILE FLASH-RAM MEMORY WITH MAGNETIC MEMORY

(71) Applicant: Avalanche Technology, Inc., Fremont, CA (US)

(72) Inventors: Rajiv Yadav Ranjan, San Jose, CA (US); Parviz Keshtbod, Los Altos Hills, CA (US); Mahmud Assar, Aptos, CA (US)

(73) Assignee: Avalanche Technology, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/892,077

(22) Filed: May 10, 2013

(65) Prior Publication Data

US 2013/0282963 A1 Oct. 24, 2013

Related U.S. Application Data

(60) Continuation of application No. 13/345,608, filed on Jan. 6, 2012, now Pat. No. 8,440,471, and a division of application No. 12/182,996, filed on Jul. 30, 2008, now Pat. No. 8,120,949, and a continuation-in-part of application No. 11/740,861, filed on Apr. 26, 2007.

(60) Provisional application No. 60/795,755, filed on Apr. 27, 2006.

(51) Int. Cl.
*G11C 11/14* (2006.01)
*G06F 12/00* (2006.01)

(52) U.S. Cl.
USPC .......... 365/171; 365/145; 365/158; 365/205; 257/291; 257/296; 257/E21.001; 257/E27.004; 257/E29.323

(58) Field of Classification Search
USPC .......... 365/145, 158, 171, 205; 257/291, 296, 257/E21.001, E27.004, E29.323
See application file for complete search history.

(56) References Cited

U.S. PATENT DOCUMENTS

| | | | |
|---|---|---|---|
| 8,120,949 B2 * | 2/2012 | Ranjan et al. | 365/171 |
| 8,391,058 B2 * | 3/2013 | Ranjan et al. | 365/171 |
| 2005/0068802 A1 * | 3/2005 | Tanaka | 365/145 |
| 2005/0251617 A1 * | 11/2005 | Sinclair et al. | 711/103 |
| 2006/0171224 A1 * | 8/2006 | Nejad et al. | 365/205 |

* cited by examiner

*Primary Examiner* — Dao H Nguyen
(74) *Attorney, Agent, or Firm* — Maryam Imam; IPxLAW Group LLP

(57) ABSTRACT

A flash-RAM memory includes non-volatile random access memory (RAM) formed on a monolithic die and non-volatile page-mode memory formed on top of the non-volatile RAM, the non-volatile page-mode memory and the non-volatile RAM reside on the monolithic die. The non-volatile RAM is formed of stacks of magnetic memory cells arranged in three-dimensional form for higher density and lower costs.

37 Claims, 20 Drawing Sheets

Current-voltage characteristics of
a typical P-N junction

| Cell size: N=1 | N=2 | N=5 | N=8 | N=10 |
|---|---|---|---|---|
| $4F^2$ | $2F^2$ | $0.8\ F^2$ | $0.5\ F^2$ | $0.4\ F^2$ |

Table 1

FIG. 26

|  | oneNAND | Mdoc | MCM Flash-SDRAM | MCM w/NOR |
|---|---|---|---|---|
|  |  | Typical : 1 Gb of NAND-Flash | | |
| RAM size | 32Kb/4Mb | 256Mb/512Mb | 512Mb (SDRAM) | 256b/512Mb (NOR) |
| Timing Performance: | | | | |
| Read | 108 MB/s | 10MB/s | 100MB/s | 100MB/s |
| Write/Program | 9 MB/s | 4MB/s | 10MB/s | 10MB/s |
| Erase - 16KB block | 2ms | 2ms | 2ms | 2ms |
| Prog+ Erase(64KB) | 33.6ms | 33.6ms | 33.6ms | 33.6ms |

Table 2

FIG. 27

| | FlashRAM (Yadav Tech) | oneNAND (Samsung) | Mdoc (M-systems) | MCM Flash-SDRAM (Micron/ others) | MCM w/NOR (Intel) |
|---|---|---|---|---|---|
| | Architecture : Normalized for 1 Gb of page-by-page storage memory | | | | |
| RAM size | 128Mb | 32Kb/4Mb | 256Mb/ 512Mb | 512Mb (SDRAM) | 256b/512Mb (NOR) |
| Timing Performance: | | | | | |
| Read | 128MB/s | 108 MB/s | 10MB/s | 100MB/s | 100MB/s |
| Write/Program | 133MB/s | 9 MB/s | 4MB/s | 10MB/s | 10MB/s |
| Erase- 16KB block | 0.001ms | 2ms | 2ms | 2ms | 2ms |
| Prog+ Erase(64KB) | 0.132ms | 33.6ms | 33.6ms | 33.6ms | 33.6ms |
| Other key attributes: | | | | | |
| Power-operational | Lowest | >10x of Flash RAM | >10x of Flash RAM | >10x of Flash RAM | >10x of Flash RAM |
| Cost ($/GB) | 1X | >4X | 6-10X | 6-10X | >10x |
| Endurance (P/E cycle) | infinite | 100k | 100k | 100k | 100k |

Table 3

FIG. 28

NON-VOLATILE FLASH-RAM MEMORY WITH MAGNETIC MEMORY

CROSS REFERENCE TO RELATED APPLICATIONS

This application is a continuation of U.S. patent application Ser. No. 13/345,608, filed on Jan. 6, 2012, by Rajiv Yadav Ranjan, et al., and entitled "A LOW-COST NON-VOLATILE FLASHRAM MEMORY", which is a divisional application of U.S. patent application Ser. No. 12/182,996, filed on Jul. 30, 2008, and entitled "LOW-COST NON-VOLATILE FLASH-RAM MEMORY", which is a continuation-in-part of U.S. patent application Ser. No. 11/740,861, filed on Apr. 26, 2007 and entitled "A High Capacity Low Cost Multi-Stacked Cross-Line Magnetic Memory," which claims priority to U.S. Provisional Application No. 60/795,755, filed on Apr. 26, 2006 and entitled "High capacity low cost multi-stacked cross-line magnetic memory," and is a continuation-in-part of U.S. patent application Ser. No. 11/674,124 entitled "Non-uniform Switching Based Non-Volatile Magnetic Base Memory," filed on Feb. 12, 2007 and a continuation-in-part of U.S. patent application Ser. No. 11/678,515 entitled "A High Capacity Low Cost Multi-State Magnetic Memory," filed on Feb. 23, 2007, and a continuation-in-part of U.S. patent application Ser. No. 11/739,648 entitled "Non-Volatile Magnetic Memory With Low Switching Current And High Thermal Stability," filed on Apr. 24, 2007, the disclosures of all of these applications are incorporated herein by reference, as though set forth in full.

BACKGROUND OF THE INVENTION

1. Field of the Invention

The present invention relates generally to hybrid memory made of magnetic memory and conventional random access memory (RAM), flash-RAM, exhibiting volatile and non-volatile magnetic memory characteristics and particularly to flash-RAM including stackable non-volatile magnetic memory.

2. Description of the Prior Art

Computers conventionally use rotating magnetic media, such as hard disk drives (HDDs), for data storage. Though widely used and commonly accepted, such media suffer from a variety of deficiencies, such as access latency, higher power dissipation, large physical size and inability to withstand any physical shock. Thus, there is a need for a new type of storage device devoid of such drawbacks.

Other dominant storage devices are dynamic random access memory (DRAM) and static RAM (SRAM) which are volatile and very costly but have fast random read/write access time, and solid state storage, such as solid-state-non-volatile-memory (SSNVM) devices. SSNVM devices have memory structures made of NOR/NAND-based flash memory, providing fast access time, increased input/output (IO) speed, decreased power dissipation and physical size and increased reliability but at a higher cost which tends to be generally multiple times higher than hard disk drives (HDDs).

Although NAND-based flash memory is more costly than HDD's, it has replaced magnetic hard drives in many applications such as digital cameras, MP3-players, cell phones, and hand held multimedia devices due, at least in part, to its characteristic of being able to retain data even when power is disconnected. However, as memory dimension requirements are dictating decreased sizes, scalability is becoming an issue because the designs of NAND-based Flash memory and DRAM memory are becoming difficult to scale with smaller dimensions. For example, NAND-based flash memory has issues related to capacitive coupling, few electrons/bit, poor error-rate performance and reduced reliability due to decreased read-write endurance. Read-write endurance refers to the number of reading, writing and erase cycles before the memory starts to degrade in performance due primarily to the high voltages required in the program, erase cycles.

It is believed that NAND flash would be extremely difficult to scale below 45 nanometers (nm). Likewise, DRAM has issues related to scaling of the trench capacitors leading to very complex designs which are becoming increasingly difficult to manufacture, leading to higher cost.

Currently, applications commonly employ combinations of EEPROM/NOR, NAND, HDD, and DRAM memory in a system design. Design of different memory technology in a product adds to design complexity, time to market and increased costs. For example, in hand-held multi-media applications incorporating various memory technologies, such as NAND Flash, DRAM and EEPROM/NOR flash memory, complexity of design is increased as are manufacturing costs and time to market. Another disadvantage is the increase in size of a device that incorporates all of these types of memories therein.

There has been an extensive effort in development of alternative technologies, such as Ovanic Ram (or phase-change memory), Ferro-electric Ram (FeRAM), Magnetic Ram (MRAM), Nanochip, and others to replace memories used in current designs such as DRAM, SRAM, EEPROM/NOR flash, NAND flash and HDD in one form or another. Although these various memory/storage technologies have created many challenges, there have been advances made in this field in recent years. MRAM seems to lead the way in terms of its progress in the past few years to replace all types of memories in the system as a universal memory solution.

One of the problems with prior art memory structures including MRAMs is their cell or memory size being too large therefore not lending itself well to scalability. A typical design of such MRAMs uses one or more transistors for one memory cells that lead to nT-1mem cell type design where n=1-6. This makes the cell size too large leading to issues of scalability and cost. Recently, current-induced magnetization switching (CIMS) is being explored as an alternative memory solution, and allegedly introduces a better way of building higher capacity MRAM type memory. But memories based on MRAM tend to have larger cell size (16-24$F^2$, where F is the minimum feature based on the lithography technology).

Therefore, in light of the foregoing, what is needed is a non-volatile magnetic memory element utilizing magnetic diodes for addressing memory cells, the memory cells capable of being stacked on top of each other (in the direction of the z-axis) enabling higher capacity, lower cost designs and scalability (independent of lithography limits).

In recent years, flash memory has become the non-volatile memory of choice for a number of mobile hand-held devices such as, the Multi-Player (MP) 3-players, digital cameras, cell-phones, hand-held computers. This is primarily due to a dramatic drop in the price of the flash memory. Flash memory is typically made using two designs namely, NAND or NOR. NOR flash is faster than NAND flash, while NAND flash has higher density. NOR flash memories are primarily used for applications where non-volatility is essential, but the size of the memory is small and the memory is seldom read or written. NAND on the other hand is used where a huge amount of memory is needed. The slow write and memory degradation due to write and erase are masked by clever designs. Both of these types of flash can have more than one bit of data stored in one cell. This is called MLC flash. This is mostly used in NAND flash to enhance the memory density, but normally adversely affects the speed of the memory.

Another form of dominant memory is the dynamic RAM (DRAM), which is volatile and costly but has faster random read/write time than non-volatile memory in the form of flash. From a cost perspective, MLC NAND is the cheapest, followed by NAND, then NOR, and then DRAM. Static RAM is the most expensive memory used.

In the current marketplace, NOR tends to be approximately five times more costly than MLC NAND, due primarily to its cell size. A typical size for a NOR memory cell is about 10-12$F^2$ vs. about 2.5$F^2$ for a NAND cell. DRAM has a cell size of 8$F^2$ but is harder to manufacture due to its various trench-capacitor design requirements. Additionally, as the process geometry decreases, the design of NAND and DRAM memory become more difficult to scale. For example, NAND has various issues related to capacitive coupling, fewer electrons/bit, poor error-rate performance and worse reliability due to its poor read-write endurance. It is believed that NAND, especially MLC NAND would be extremely difficult to scale below 45 nano meters (nm). Likewise, DRAM has issues related to scaling of its trench capacitors leading to very complex designs which are becoming very difficult to manufacture, thereby leading to increased manufacturing costs.

FIG. 1(a) shows a prior art system including a host, or central processing unit (CPU) 600 coupled to transfer information to and from non-volatile memory 602 (or read-only memory (ROM) and RAM), which may be in the form of NOR or NAND and further coupled to volatile memory 604, such as DRAM. In some systems, non-volatile memory 602 includes both NOR and NAND. Current high performance systems, such as that of FIG. 1(a), require capability for loading boot code and operating system (OS) code. The boot code typically resides in non-volatile memory 602 while the operating system (OS) code typically resides on a hard disk drive and is downloaded onto the DRAM 604 and/or NAND when the non-volatile memory 602 includes NAND as well.

In general, a combination of NOR, NAND and DRAM is used for functioning as both RAM and ROM, reducing the overall cost of the memory system. This is a dominant part of the overall cost for mobile multi-media products. This group of memory products is referred to as "hybrid-flash." Table 2 shows speed performances of hybrid flash products currently available in the market. The type and size, as well as architecture of these products are generally different, resulting in different overall timing performance, For example, the one-NAND product, manufactured by Samsung Electronics of South Korea has a smaller-sized DRAM, but the architecture and design are such that it results in higher write speed while maintaining lower cost. Depending upon the application, the system designers may choose to include additional DRAM in order to improve the overall system performance. There are a number of other such products by various manufacturers for this fast growing segment of the market, driven by the insurgence of various hand-held mobile devices.

In FIG. 1(a), application code is shadowed (or copied) from non-volatile memory 602 to volatile memory 604 which then carries out the operations with the operating system.

The problem with all of the currently available hybrid designs is the large size and therefore high costs and high power consumption associated therewith. That is, ROM and RAM are manufactured on multiple chips, and perhaps a monolithic die, resulting in larger real estate being consumed by use of such memory, and therefore increased costs. In some examples, one unit of the memory capacity of a typical "hybrid-flash" product today is made of DRAM for every two units of NAND, i.e. 512 MB of DRAM for every 1 GB of NAND. This capacity usage on a printed circuit board (PCB) that additionally has other chips (or semiconductor), such as a controller, make such designs approximately 5 to 10 times more expensive than the NAND memory.

Additionally, power consumption is high due to the operations of non-volatile and volatile memory, of which the volatile memory has to stay on the standby power all the time.

Accordingly, the need arises for a hybrid memory including both volatile and non-volatile memory that is lower in power consumption, less costly to manufacture, and occupies less space.

SUMMARY OF THE INVENTION

To overcome the limitations in the prior art described above, and to overcome other limitations that will become apparent upon reading and understanding the present specification, the present invention discloses a method and a corresponding structure for a magnetic storage memory device that is based on current-induced-magnetization-switching having reduced switching current in the magnetic memory and high memory capacity.

Briefly, an embodiment of the present invention includes a A flash-RAM memory includes non-volatile random access memory (RAM) formed on a monolithic die and non-volatile page-mode memory formed on top of the non-volatile RAM, the non-volatile page-mode memory and the non-volatile RAM reside on the monolithic die.

These and other objects and advantages of the present invention will no doubt become apparent to those skilled in the art after having read the following detailed description of the preferred embodiments illustrated in the several figures of the drawing.

IN THE DRAWINGS

Figure 15:
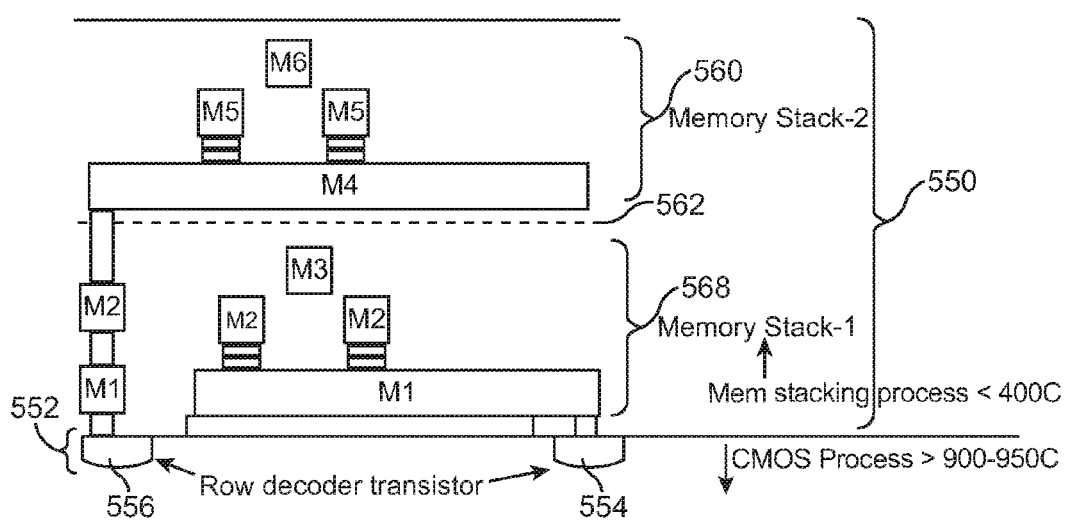

FIG. 15 shows a stack of memory 550 including a first stack 568 on top of which is formed a second stack 560

Figure 16:
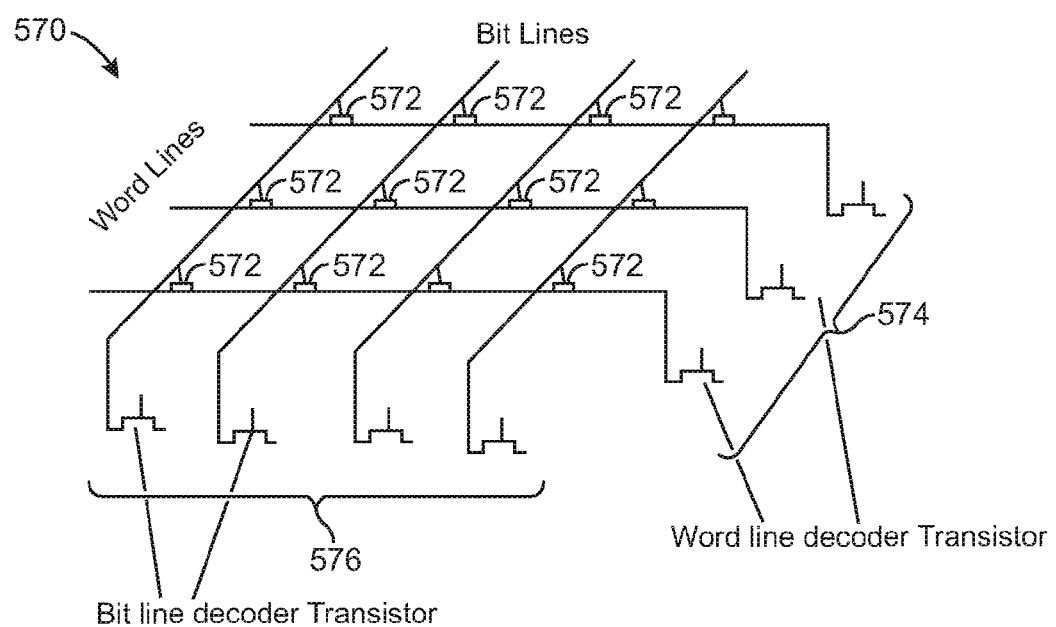

FIG. 16 shows a three dimensional perspective view of a memory structure 570 including an array of memory elements 572 and multiple word line decoder transistors 574 and multiple bit line decoder transistors 576.

Figure 17:
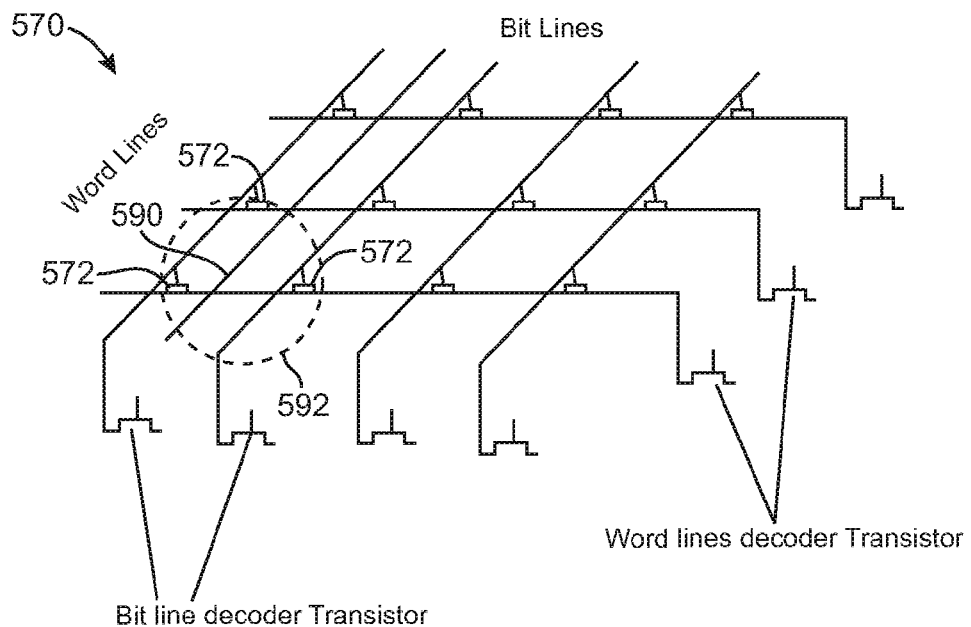

FIG. 17 shows the memory structure 570 of FIG. 16 with the addition of an erase or program line 590 shown between two of the bit lines.

Figure 18:
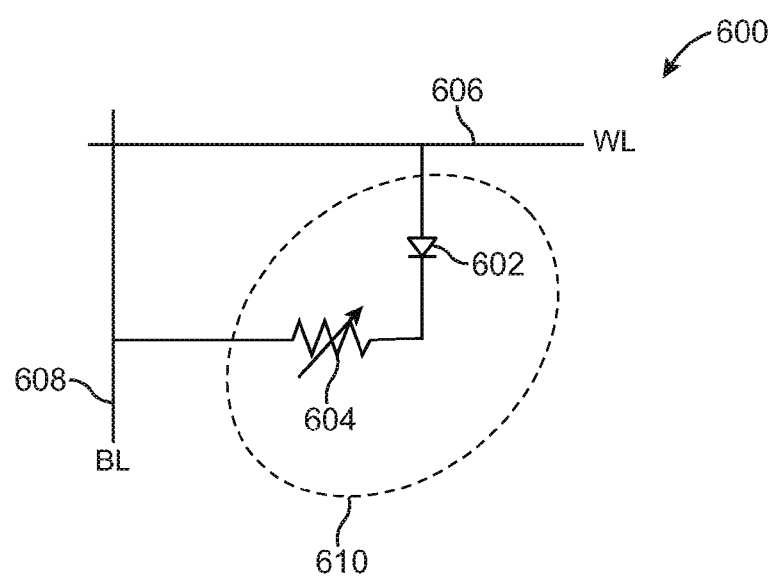

FIG. 18 shows a representation 600 of the behavior of the memory element 10 or 572 with respect to the word line 606 and the bit line 608.

Figure 19:
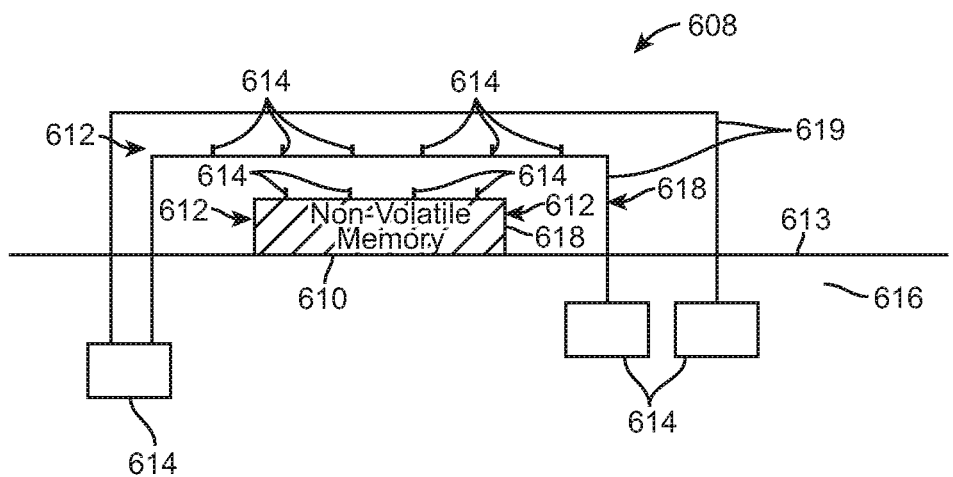

FIG. 19 shows the side view of a flash-RAM 608 including volatile memory 610 and non-volatile memory 612 and transistors 614, in accordance with an embodiment of the present invention.

Figure 20:
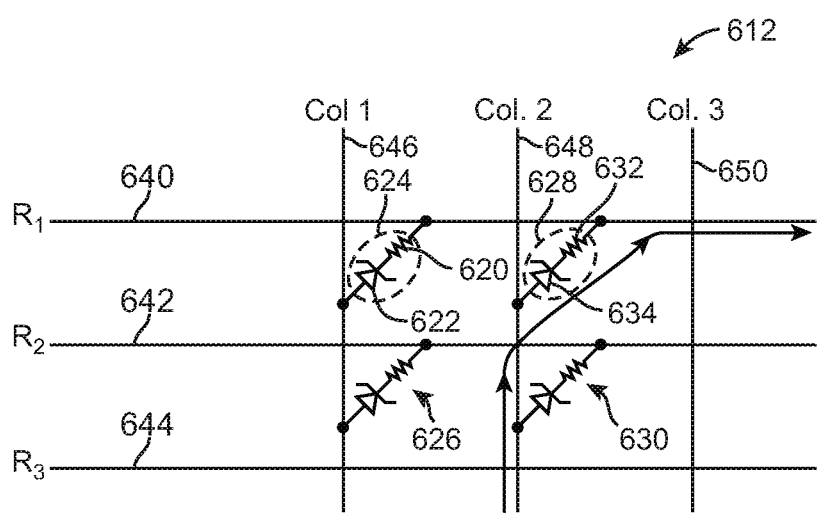

FIG. 20 shows further details of the stack 612 whose magnetic memory elements 624-630 appear in rows and columns and are coupled to word lines 640-644, appearing as rows, and bit lines 646-650, appearing as columns.

Figure 21:
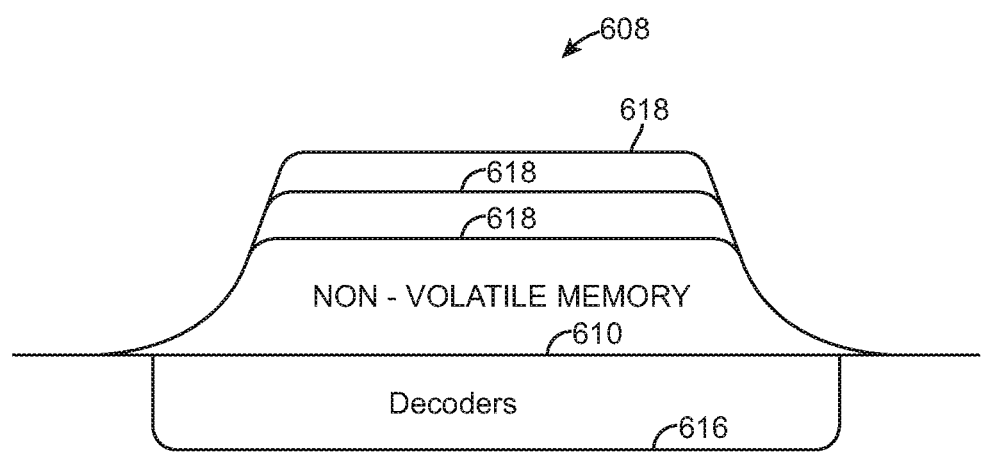

FIG. 21 shows the flash-RAM 608 with the silicon 616 shown to include decoders, which are typically made of transistors, such as the transistors 614.

Figure 22:
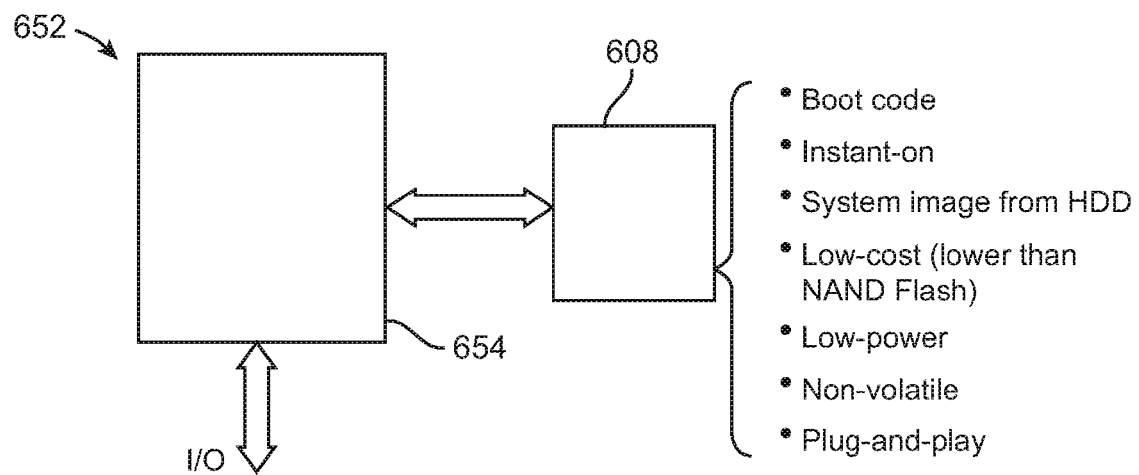

FIG. 22 shows one of numerous applications of the flash-RAM 608.

Figure 23:
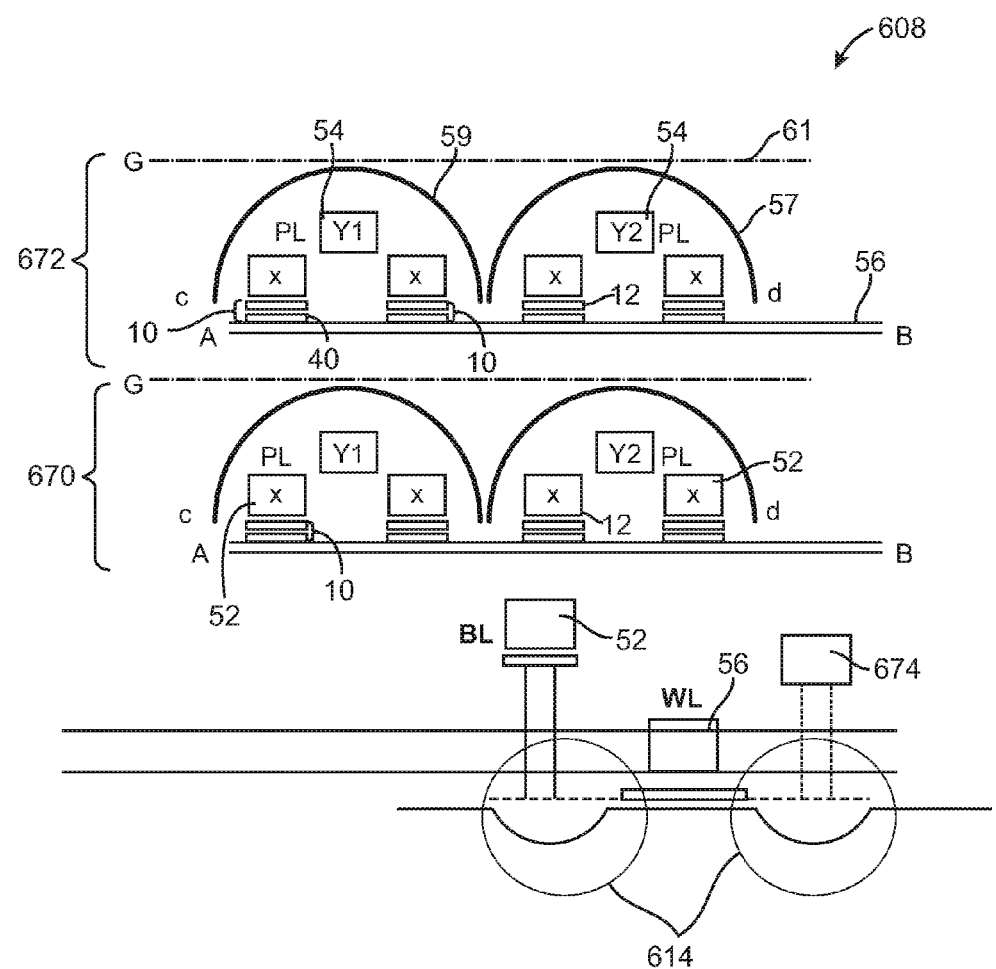

FIG. 23 shows two stacks 670 and 672 of memory elements 10 (or flash-RAM 608), in accordance with an embodiment of the present invention.

Figure 24:
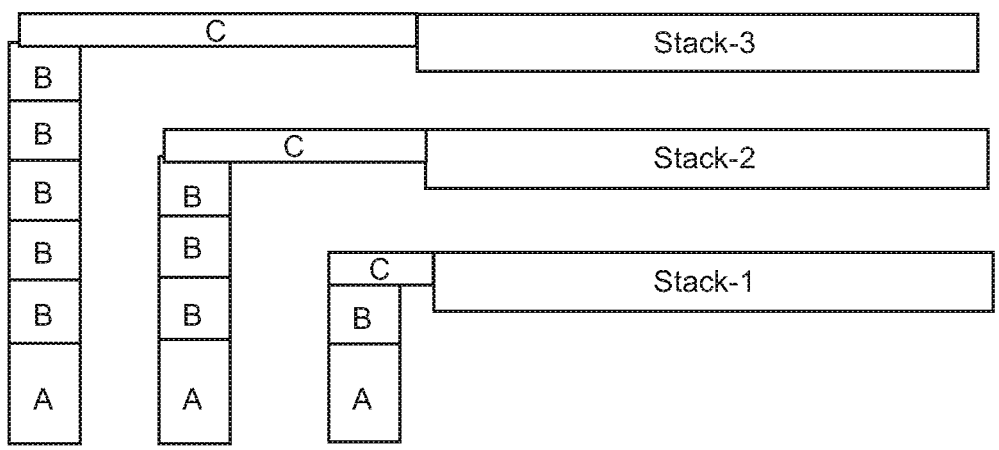

FIG. 24 shows connections of three stacks of memory elements to the bit line or word line and to the CMOS transistor which are fabricated first on the substrate surface.

Figure 25:
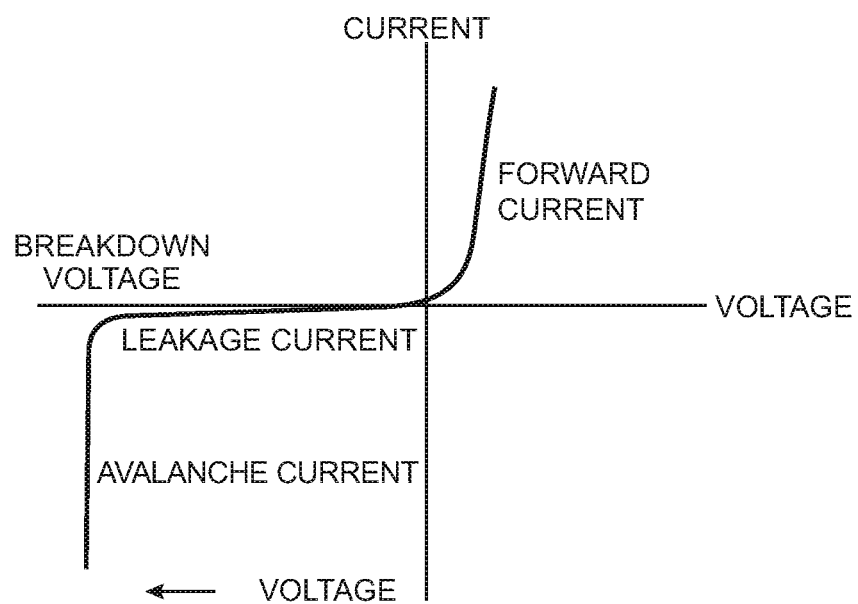

FIG. 25 shows the I (current)–V (voltage) characteristics of a Zener diode.

FIG. 26 shows Table 1 that shows the effect of number of stacks on the memory cell size in $F^2$.

FIG. 27 shows Table 2 that shows performances of some currently-available hybrid-flash memory products.

FIG. 28 shows Table 3 that shows a comparison of the timing performance of the flash-RAM 608 with other hybrid-memory products currently available in the marketplace.

DETAILED DESCRIPTION OF THE PREFERRED EMBODIMENT

In the following description of the embodiments, reference is made to the accompanying drawings that form a part hereof, and in which is shown by way of illustration of the specific embodiments in which the invention may be practiced. It is to be understood that other embodiments may be utilized because structural changes may be made without departing from the scope of the present invention. It should be noted that the figures discussed herein are not drawn to scale and thicknesses of lines are not indicative of actual sizes.

In an embodiment of the present invention, a diode-addressable current-induced magnetization switching (CIMS) memory element is disclosed. In one embodiment of the present invention, the memory element includes a magnetic tunnel junction (MTJ) on top of which is formed a diode for storing digital information. The memory element is stackable into arrays with memory elements in each stack, and each stack separated by deposited dielectric and CMPed (chemically mechanically polished) surface. In an embodiment of the present invention, a magnetic shielding layer magnetically isolates one stack of memory elements from other stacks.

Figure 1:
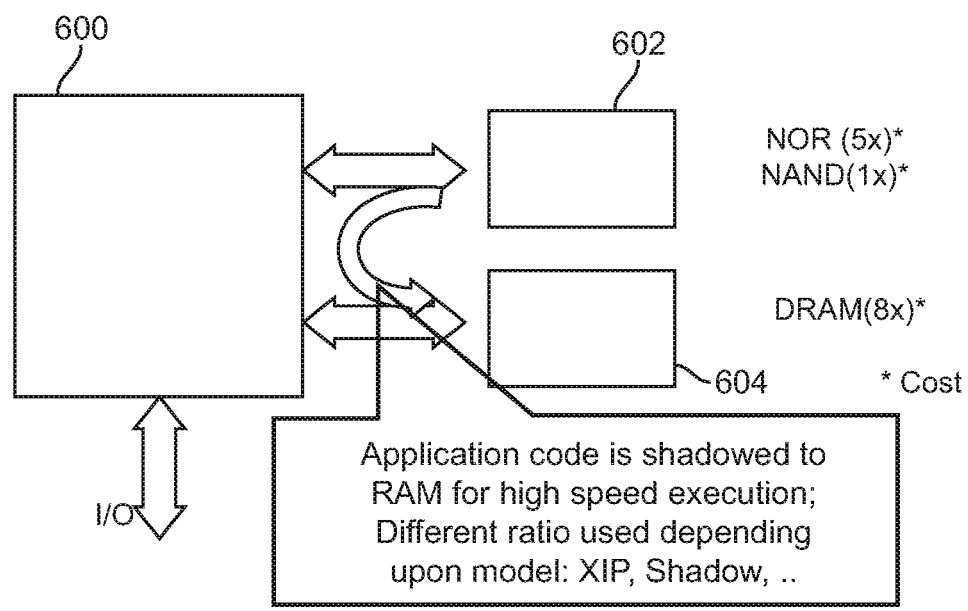
FIG. 1(a) shows a prior art system including a host using volatile memory and non-volatile memory.
FIG. 1(b) shows relevant layers of a diode-addressable current-induced magnetization switching (CIMS) memory element 10, in accordance with an embodiment of the present invention.
Figure 1B:
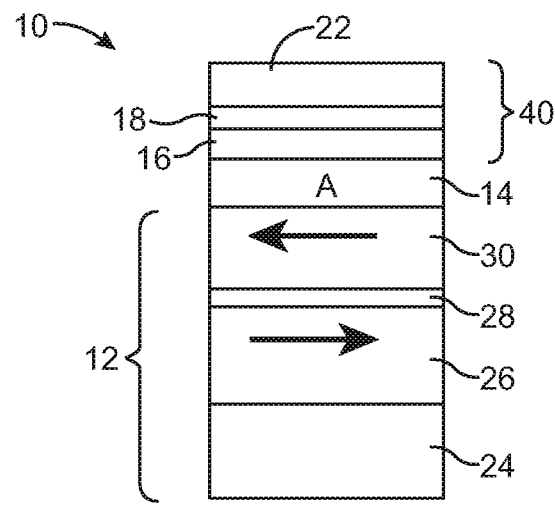

Referring now to FIG. 1(b), relevant layers of a diode-addressable current-induced magnetization switching (CIMS) memory element 10 is shown, in accordance with an embodiment of the present invention. The memory element 10 is shown to include a magnetic tunnel junction (MTJ) 12 on top of which is formed a thin-film diode 40 separated from the MTJ 12 by a conductive seeding silicon layer 14. The MTJ 12 is shown to include a pinning layer 24, on top of which is formed a fixed layer 26, on top of which is formed a tunnel layer 28, and on top of which is formed a free layer 30. In one embodiment of the present invention, the diode 40 is a magnetic diode, in another embodiment of the present invention the diode 40 is a Schottkey type of diode, and in yet another embodiment of the present invention, the diode 40 is a silicon type of diode. In the case of the latter, in an exemplary embodiment, the layer 22 is made of n-type or p-type doped silicon using silicon nitride (SiN), silicon phosphor (SiP), silicon germanium (SiGe), or silicon boron (SiB), or any combination thereof.

It should be noted that the memory element 10, in various embodiments, may have a structure such as that disclosed in U.S. patent application Ser. No. 11/674,124 entitled "Non-uniform Switching Based Non-Volatile Magnetic Base Memory," filed on Feb. 12, 2007 or U.S. patent application Ser. No. 11/678,515 entitled "A High Capacity Low Cost Multi-State Magnetic Memory," filed on Feb. 23, 2007, or U.S. patent application Ser. No. 11/739,648 entitled "Non-volatile Magnetic Memory With Low Switching Current And High Thermal Stability", filed on Apr. 24, 2007, the disclosures of which are incorporated herein by reference, as though set forth in full.

The memory element of FIG. 1(b) includes a diode on top of a MTJ, as stated above. The layers 16, 18 and 22 each correspond to the thin-film diode where, in an exemplary embodiment, the layer 22 is n-doped or p-doped silicon, the layer 18 is an oxide layer such as MgOx or AlOx and the layer 16 is a ferromagnetic layer such as CoFeB. Layers 24, 26, 28 and 30 of the MTJ correspond to the magnetic-tunnel junction. The layer 24 is the seed-layer and may also act as the bottom electrode layer, and maybe made out of tantalum (Ta) in one embodiment of the present invention.

In one embodiment, the layer 24 may consist of a number of layers including an anti-ferromagnetic layer consisting of PtMn or IrMn. The pinning layer 24 is used to pin the magnetic moment of fixed layer 26. The fixed layer 26 is typically made of CoFeBPtX where the ratios of Fe, Co, Pt and B are varied to make sure that the resulting alloy has a substantially amorphous structure. Layer 28 is made of an oxide, typically MgOx where x<=1. This may be a very thin layer of Mg, typically less than 5 Å, to get the proper crystalline structure of the MgOx layer required for good tunneling characteristics. Layer 30 can have a similar material properties and structure as layer 26, and is made of CoFeBPtX alloy. Layer 26 is the "fixed" layer, in that the magnetic orientation is locked in a predetermined orientation based on the induced magnetic anisotropy and the magnetic annealing of the anti-ferromagnetic layer. In one embodiment the layer 26 also includes a layer of Ruthenium and CoFe which results in the formation of a synthetic anti-ferromagnetic layer. Layer 30 is the "free-layer" and the direction of its magnetic moment is altered by the input current. The two states of fixed versus free-layer, being parallel and anti-parallel, induce different resistances, leading to "0" and "1" states.

The layer 14 is the base isolation layer on which the diode 40 is deposited. In an exemplary embodiment, the diode 40 has the structure of ferro-magnetic (FM)/oxide/N—Si where, the layer 16 is the n-doped Si, the layer 18 is the oxide layer selected from any of: MgOx, AlOx, or ZrOx, and the layer 22 is a ferromagnetic layer comprising of Co—Fe—B—Pt and acts as spin-injection layer. Although the embodiment shown in FIG. 1, shows magnetic moments being in-plane for the various layers, the magnetic moments can also be perpendicular to the plane of the memory element 10, which is especially useful for higher capacity memory. Also, the location of the diode 40 can be either on top or bottom of the MTJ 12, as will be shown in other embodiments, depending upon the relative location of "electrodes" as well as the bit lines and the word lines. The in-plane design has the memory elements having elongated, such as ellipsoid, type structure where the long axis is parallel to the "easy-axis" of the magnetic layers. The perpendicular designs have in-plane circular shape. This enables stacking the memory elements, made of the memory element 10, much closer together and thereby obtaining much higher density of memory or storage capacity. In a yet another embodiment, the thin-film diode layer 40 is deposited underneath the magnetic tunnel junction (MTJ) 12, and has a much larger size than the MTJ memory layer, and is formed by using two separate masking and etching processes.

The MTJ 12 acts like a resistor in series with the diode 40. The diode 40 is essentially used to address the memory element 10 for programming, erasing and/or reading operations. In operation, current is applied at memory element 10 in the direction that is favorable to the diode. The thin film diode may have different characteristics based on the structure of the memory element 10. In one embodiment of the present invention, current flowing from the bottom up in FIG. 1 is the low resistance direction, while the current flowing from top down is the high resistance direction, similar to the "reverse" direction of a p-n junction.

The starting state of this magnetic memory is parallel for the magnetic moments of layers 26 and 30. This is the low resistance state. When a current of, for example, 300 microamps is applied from the bottom up, for memory element having a size of 100 nm×150 nm, the majority spins travel across the barrier, while the minority "opposite" spins are reflected back into the free layer 30. This applies enough torque to the magnetic moment of free layer 30 to flip it in the opposite direction, as shown by the opposing arrows in FIG. 1(b). This is the high resistance state. In one embodiment the resistance of the low resistance state is between 400 to 600 ohms, while the high resistance state is between 1200 to 1500 ohms.

Figure 2:
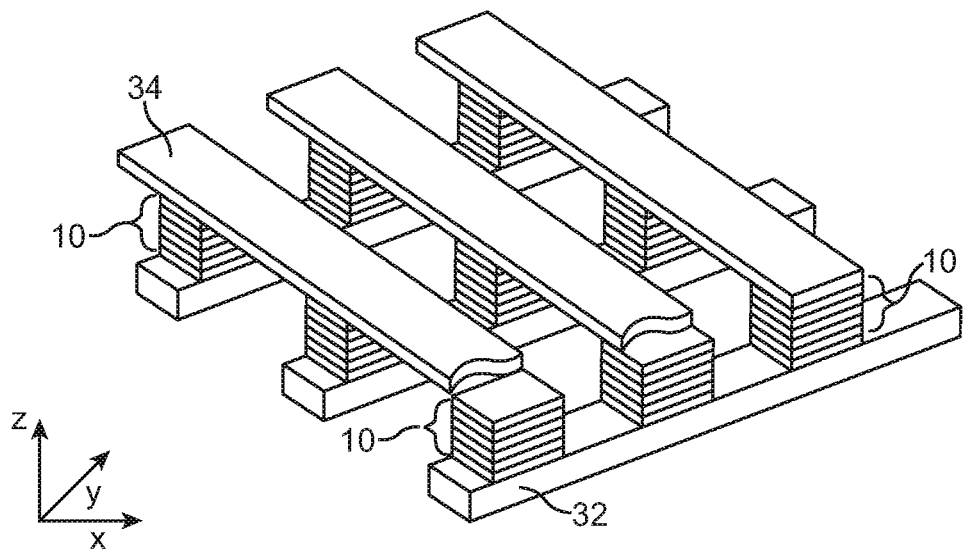
FIG. 2 shows a three-dimensional perspective view of an array of memory comprised of multiple memory elements 10.

FIG. 2 shows a three-dimensional perspective view of an array of memory comprised of a number of memory elements 10. The memory elements 10 are coupled using bit lines 32 and word lines 34 to form an array of memory elements. Another array of memory elements 10 may be stacked on top of the word line 34, in the direction of the z-axis and another set may be stacked on top of another word line and so on, forming a three-dimensional stack of memory elements 10, or any other memory element described or shown herein.

Figure 3:
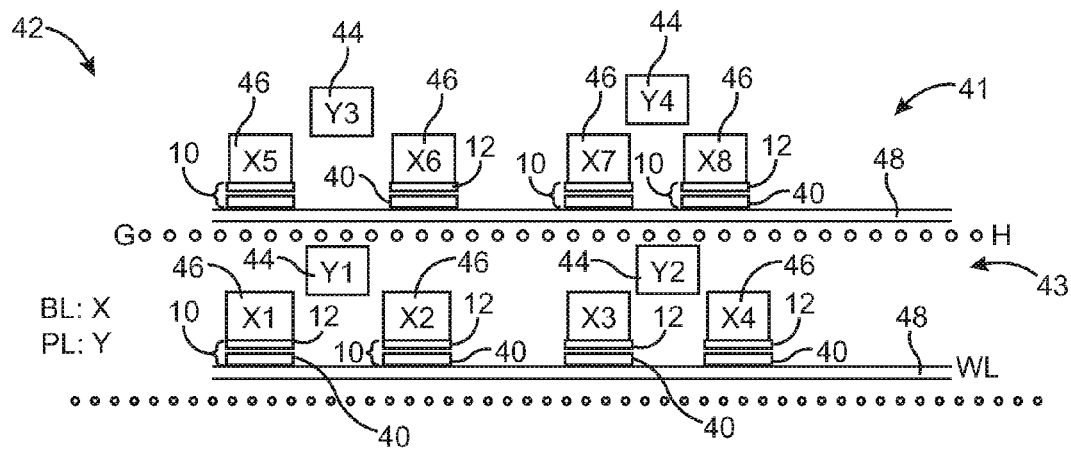
FIG. 3 shows a stack 42 of CIMS memory elements, in accordance with an embodiment of the present invention.

FIG. 3 shows a stack of CIMS memory elements 42, in accordance with an embodiment of the present invention. The stack 42 is shown to include one stack of elements 41 stacked on top of another stack of memory elements 43, with each stack separated from the other by a CMPed (chemically mechanically polished) surface (surface 61 in FIG. 4). Each stack includes a number of memory elements, such as the memory element 10 of FIG. 1(b). As shown and discussed in FIG. 1(b), each memory element 10 includes a diode 40 and a MTJ 12 and similarly, each of the memory elements 10 of the stack of elements 41 also includes a diode 40 and a MTJ 12.

The diode 40 of each of the memory elements 10 of the stack of elements 41 is shown formed on top of the word line 48, and the diode 40 of each of the memory elements 10 of the stack of elements 43 is also shown formed on the word line 48. The word lines 48 for each stack of elements 41 and 43 are different, as are the bit lines 46 shown formed on top of each of the memory elements 10.

In FIG. 3, the program lines 44 are shown formed above and between every two memory elements 10 and the bit lines 46. The program lines 44 and the word lines 48 are essentially made of metal. By way of perspective, the bit lines 46 and the program lines 44 are wires going into the page. Erasing, as referred thereto at times, is achieved using the program lines 44.

Figure 4:
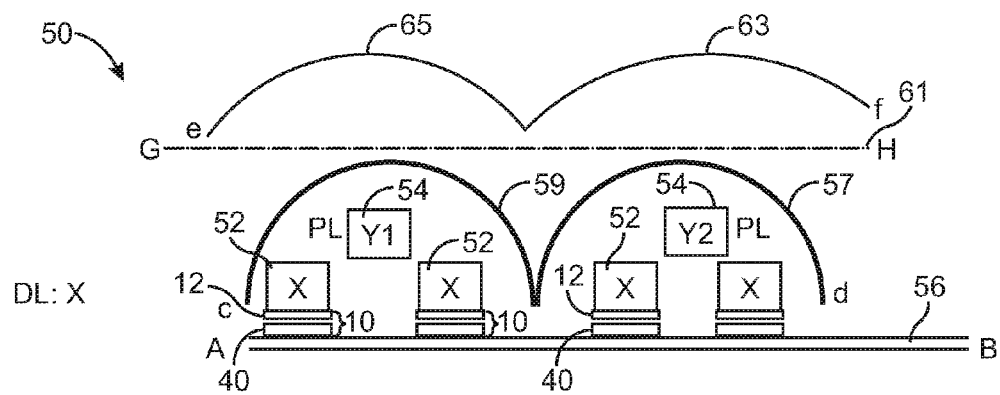
FIG. 4 shows a memory structure 50, in accordance with another embodiment of the present invention.

A magnetic shield 57 encompasses the top and sides of two of the bit lines and memory elements and program line, as shown in FIG. 4. Magnetic shield 59 encompasses the top and sides of another two of the bit lines, memory elements, and program line, as also shown in FIG. 4. In an exemplary embodiment the magnetic shields 57 and 59 are made of a granular film comprising a mixture of nano-particles of high permeability magnetic alloy such as conetic alloy in an oxide or nitride matrix, where the oxide may be SiO2 or nitride may be SiN. These nano-particles of the high permeability magnetic alloy tend to be almost super-paramagnetic and couple together in the presence of a magnetic field, such as that created during the erase operation. It is very likely that a thin layer, 10-50 nm, of magnetic alloy may be deposited on top of the program line to focus the net magnetic field towards the memory element 10. This would lead to a lower erase current.

In the embodiment of FIG. 3, for each stack of elements 41 and 43 there is further shown erase lines 44 used for erasing of the memory elements 10. When the word line of a set of elements is excited, activating a set of elements, and then a bit line is excited to activate a particular memory element of the selected set of elements, a corresponding program line is used to program the activated or selected memory element to a particular value.

FIG. 3 shows the stacking of the memory elements 10, as previously noted. To build the embodiment of FIG. 3, as will be further described in additional figures later, the process includes using a CMOS process to form the decoder that would drive the word and bit lines at all stacked elements. The word lines are then formed on top thereof using aluminum (Al) or copper (Cu) or other metals. The memory elements are deposited with appropriate masking technique in each stack. The memory elements have the structure as described earlier. The bit lines are covered by a thin silicon nitride (SiNx) and/or/both silicon oxide layer overcoat. The erase lines Y1 and Y2 are then deposited. These are followed by further encapsulation using further deposition of SiNx or silicon oxide layer. A magnetic shielding layer, such as that shown in FIG. 4, is deposited, and in an exemplary embodiment includes a mixture of oxides/nitrides such as SiO2, SiNx, and/or ZrO2, with a soft-magnetic material having very high permeability, such as the conetic alloys of Ni—Fe—Cu—Mo (example being $Ni_{77}Fe_{14}Cu_5Mo_4$). A typical thickness of the magnetic shield layer is approximately less than 1 μm. The magnetic shield layer keeps the stray magnetic field from the erase lines 44 contained for bit lines 46.

The magnetic shielding layer, such as the layer 57 in FIG. 4, also protects the recorded bits from any disturbance from outside of the stray magnetic field, such as from other devices, whether applied intentionally or unintentionally. The magnetic shielding layer is followed by the deposition of SiNx or silicon-oxide layer to a thickness up to curves 63 and 65, or e-f, in FIG. 4. This is followed by CMP (chemical mechanical polishing) to smooth the surface thereof down to G-H in FIG. 3, or 61 in FIG. 4. Layer G-H acts as the fresh layer on which additional word lines 48, memory elements 10, bit lines 46 and then the erase lines 44 are deposited. This sequence of formation can continue to add a number of memory layers leading to a 3-dimensional memory structure thereby increasing density and lowering costs. It should be noted that the relative positions of word lines and the bit lines can be interchanged depending on the memory cell design, the relative location of the diode with respect to the magnetic free-layer, and the magnetic fixed-layer of the memory element.

Figure 5:
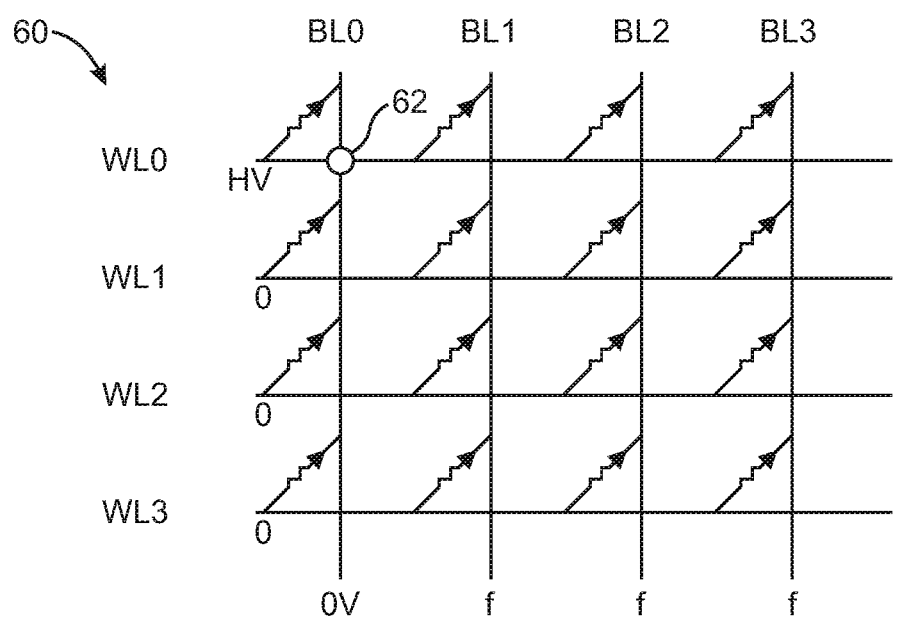
FIG. 5 shows a cross-linked memory structure 60, made of the memory element 10 of FIG. 1, for addressing or selecting of bits therein, in accordance with an embodiment of the present invention.

One key aspect of the memory structures of the various embodiments herein is that the electrical current flows perpendicular to the memory-element 10, and provides the necessary torque to the magnetic-spins to cause current-induced magnetization switching, CIMS, leading to parallel and anti-parallel magnetic states of free versus pinned fixed layers. The memory architecture utilizes orthogonal word line and bit line architecture, as shown in FIG. 5. In one embodiment, as shown in FIG. 5, all the word lines are grounded except the one of concern, WL0, which is raised high. The corresponding bit-line BL0 is grounded during programming or connected to a sense amplifier during reading. Other bit-lines, BL1 . . . BL3 are kept floating.

The cell-size of memory element 10, in an exemplary embodiment is: $4F^2/N$, where N corresponds to the number of memory layers which are stacked on top. As shown in Table 1, as the number of stacks increase, the cell size decreases proportionately.

In accordance with Table 1, for N=8, the cell size is $0.5F^2$, this is same as that of the current hard-disk drives. Hard-disk drives are highest density storage device and thereby lowest cost. It is believed that in 3-5 years the hard-disk drive industry will employ patterned media to achieve higher areal density. The patterned media has a cell size of $F^2$. Thus the N=8 and N=10 based memory per this invention is the smallest cell-size memory-storage device possible, leading to the lowest cost storage-memory.

FIG. 4 shows a memory structure 50, in accordance with another embodiment of the present invention. The structure 50 is shown to include a word line 56, essentially made of metal, bit lines 52 formed on top of the memory elements 10, and erase/program lines 54 shown positioned between every two memory elements 10, much in the same manner as that shown with respect to the embodiment of FIG. 3.

It should be noted that erase/program lines 54 are used to reset the memory to low resistance or "0" state through the application of current, and typically a large block of memory, sometimes referred to as page or block, is reset at one time. The size of the page or block is selected based on the power requirement as well as the end-user's application requirement. For example, if the application requires more frequent writing and erasing of less than 512 bits, then the page or block size is selected to be some multiple of 512 bits. Program lines 44 have the same function as program lines 54. The terms "program line" and "erase line" are used synonymously herein. As explained earlier, changing of the state of the memory (such as from "low" resistance to "high" resistance) is carried out by changing the direction of the current through the MTJ, which is referred herein as "writing" of the memory.

In FIG. 4, the memory structure 50 is similar to the memory structure 42 of FIG. 3 but additional details thereof are shown. Magnetic shielding layer 57 is shown to cover the top and sides of two bit lines 52, their respective memory elements 10, and a program line 54; and magnetic shielding layer 59 is shown to cover the top and sides of two other bit lines 52, their respective memory elements 10, and a program line 54. The magnetic shielding layers 57 and 59 serve to shield the magnetic field of the program lines 54 so as to prevent the magnetic field from going up and affecting the memory elements of layer 41 when the memory elements of stack 43 directly below are being erased. Further shown in FIG. 4, the layers 57 and 59 are CMPed down to surface 61 to smooth the layers 57 and 59. The surface 65 and the surface 63 serve to indicate the dielectric surface of SiO2 or SiNx prior to being smoothened by the CMP process. In one embodiment of the present invention, the surface 65 and 63 are made of SiO2 while the underlying layer is SiNx, followed by the magnetic shielding layer; all of which are deposited by a combination of CVD and PVD processes.

FIG. 5 shows a cross-lined memory structure 60 for addressing or selecting of bits therein, made of the memory element 10 of FIG. 1, in accordance with an embodiment of the present invention. In FIG. 5, a two-dimensional top view of the bit and word lines of the structure 60, shown in a 3-D view in FIG. 2, is shown. Bit lines BL0-BL3 are shown as vertical lines and generally made of metal or wires, as are word lines WL0-WL3 shown as horizontal lines crossing the bit lines BL0-BL3. While four bit lines and four word lines are shown to form the structure 60, it is understood that any number of bit lines and/or word lines may be employed without departing from the scope and spirit of the present invention.

Each of the crossings of a word line and a bit line is met by a memory element, such as the memory element 10. Thus, an array of memory elements are formed at each of the crossings of the word lines WL0-WL3 with the bit lines BL0-BL3, respectively.

Typically and when not selecting any memory elements, the word lines are at a substantially 0 V state. When a word line is driven to a positive (+) voltage, such as 1 volts (V), the word line selects the row of bit lines that it crosses and if a bit line is at a ground voltage, the memory element that is positioned at the crossing of the foregoing word and bit lines, is selected and is written. For example, in FIG. 5, a memory element at 62 is selected because the word line WL0 is driven to 1V and BL0 is driven to 0V thereby selecting the memory element positioned at the crossing of the WL0 and the BL0, for programming. During a read operation, the selected bit line BL0 is coupled to a sense amplifier, which determines whether the logic state of the corresponding cell is "0" or "1" based on the value of the MTJ resistance.

Figure 6:
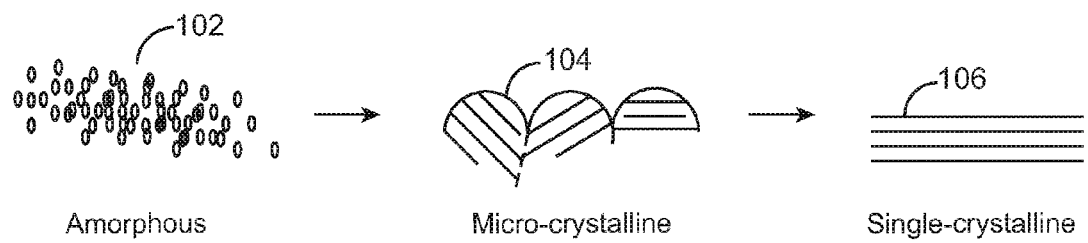
FIG. 6 shows the physical states of the diode 40 of the memory element 10, in accordance with an embodiment of the present invention.

FIG. 6 shows the physical states of the key thin-film silicon-layers of the diode 40 of the memory element 10 of FIG. 1(b). The silicon thin film used therein, in one embodiment of the present invention, has various crystal states. In FIG. 6, the silicon thin film is amorphous at 102, and when it is supplied with some external energy such as from a heat source, it becomes microcrystalline as shown at 104, and when further additional energy is supplied, it becomes single-crystalline as shown at 106.

While the energy source may be a heating source, such as a rapid thermal annealing process in one embodiment of the present invention, during manufacturing of the magnetic memory elements the MTJ should not be affected by the processing of the diode. In an exemplary method of achieving the latter, three techniques are employed to ensure that the magnetic structure of the MTJ 12 is not impacted during deposition of the thin-film diode 40, namely, (i) a nucleating layer is used that is of less than 20 nano meters (nm) in thickness of one of more metals or their alloys chosen from the following material: Co (cobalt), Ni (nickel), Pt (platinum); (ii) deposition of these film using a PVD (physical deposition process) such as using RF- or DC-magnetron sputtering under typically a low argon pressure of less than 10 millitorr and having less than 50 percent of H2 in the gas; and (iii) having a pulsed laser source for heating, such as using a Nd-YAG laser of peak power less than 2 kw at 20 Khz. Laser annealing is typically carried out in the vacuum following the deposition of the silicon seeding layer 14, such as shown in FIG. 1. In an alternative embodiment, an additional metal isolation layer is used, of thickness less than 100 nm, and deposited to ensure heating during laser annealing, which remains focused on the seeding-Si layer 14 of FIG. 1(*b*).

Figure 7:
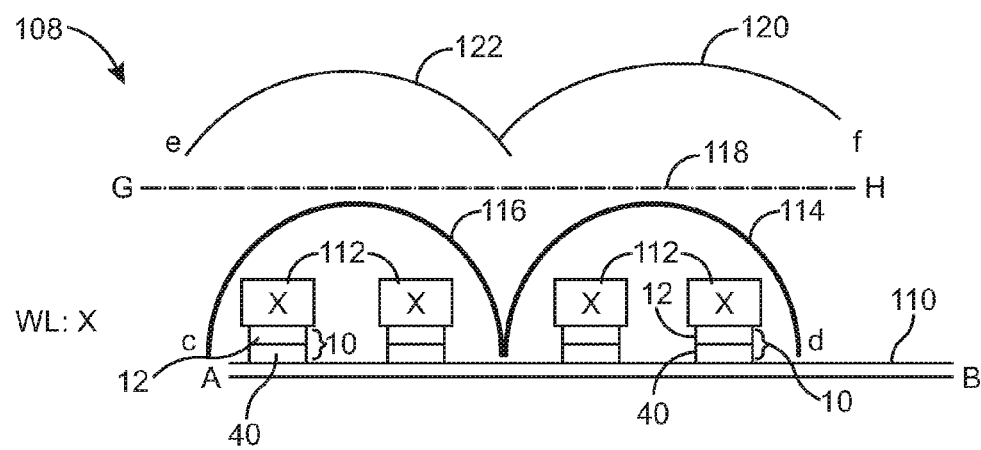
FIGS. 7 and 8 show two different examples of a one-time programmable memory for the "storage" flash portion of flash-RAM, made of memory elements 10, in accordance with different embodiments of the present invention.
Figure 8:
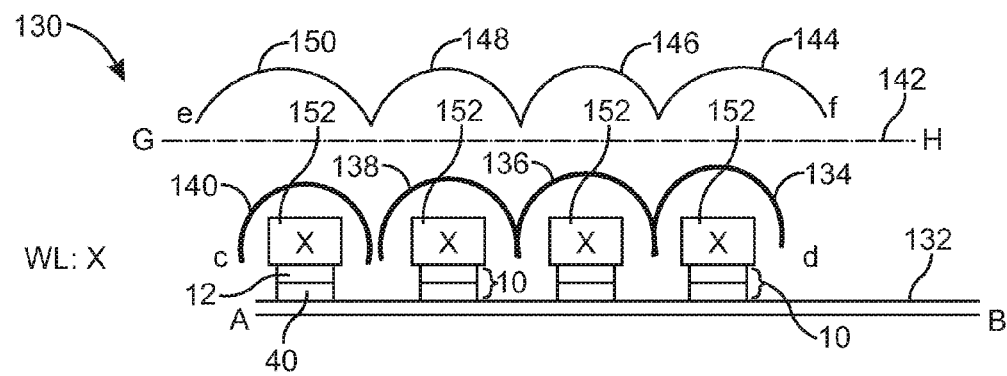

FIGS. 7 and 8 show two different examples of a one-time programmable memory, made of memory elements 10, in accordance with different embodiments of the present invention. In FIG. 8(*a*), a one-time programmable memory structure 108 is shown to include a word line 110, on top of which is shown formed a number of memory elements 10, each comprising a diode 40 and a MTJ 12, and on top of the memory elements 10 are shown formed bit lines 112, which are essentially made of metal extending into the page. Every two memory elements are surrounded, on top, by a magnetic shielding layer 114 or a magnetic shielding layer 116, which serve to magnetically shield the bit lines 112. The layer 114 and layer 116 are CMPed down to a level indicated at 118, smoothing them. After CMP, dielectric SiO2 or SiNx surfaces 120 and 122 are smooth to surface 118, marked as GH.

Additional stacks of memory can be deposited on top of the smooth surface 118, as mentioned with respect to earlier embodiments. The memory elements 10 are programmed by passing current from the bottom thereof. The memory element, in the initial state, has both the layer 26 and the layer 30 having magnetization in the same direction, as set by the magnetic annealing process. This is the low-resistance state. When a higher current, for example, 300 micro-amps, for a memory cell of size 90 nm×140 nm, is applied from the bottom of the memory element 10 for writing or programming (as compared to the read current of 50 micro-amps) spin-polarized electron having spins anti-parallel to the free layer are reflected back into the free layer 30, and switch the magnetic moment of the free layer into the anti-parallel direction as shown by arrow in FIG. 1(*b*). This is the high-resistance state. Since the memory elements of FIGS. 7 and 8 cannot be re-programmed, they are accordingly referred to as one-time programmable memory.

In FIG. 8, a one-time programmable memory structure 130 is shown to include a word line 132 on top of which is shown formed a number of memory elements 10, each comprising a diode 40 and a MTJ 12, and on top of the memory elements 10 are shown formed bit lines 152, which are essentially made of metal extending into the page. Every memory element is surrounded, on top, by a magnetic shielding layer 134, a magnetic shielding layer 136, a magnetic shielding layer 138, or a magnetic shielding layer 140, which are shields for magnetically shielding the memory elements 10 from the top stacks as well as any unwanted or accidental magnetic field. The layers 144, 146, 148 and 150 are chemically mechanically polished (CMPed) to level or smooth them, such as shown at 142. The memory elements 10 of FIGS. 7 and 8 are programmed by passing an up-programming current as explained earlier, cannot be re-programmed, and are accordingly referred to as one-time programmable memory.

Figure 9:
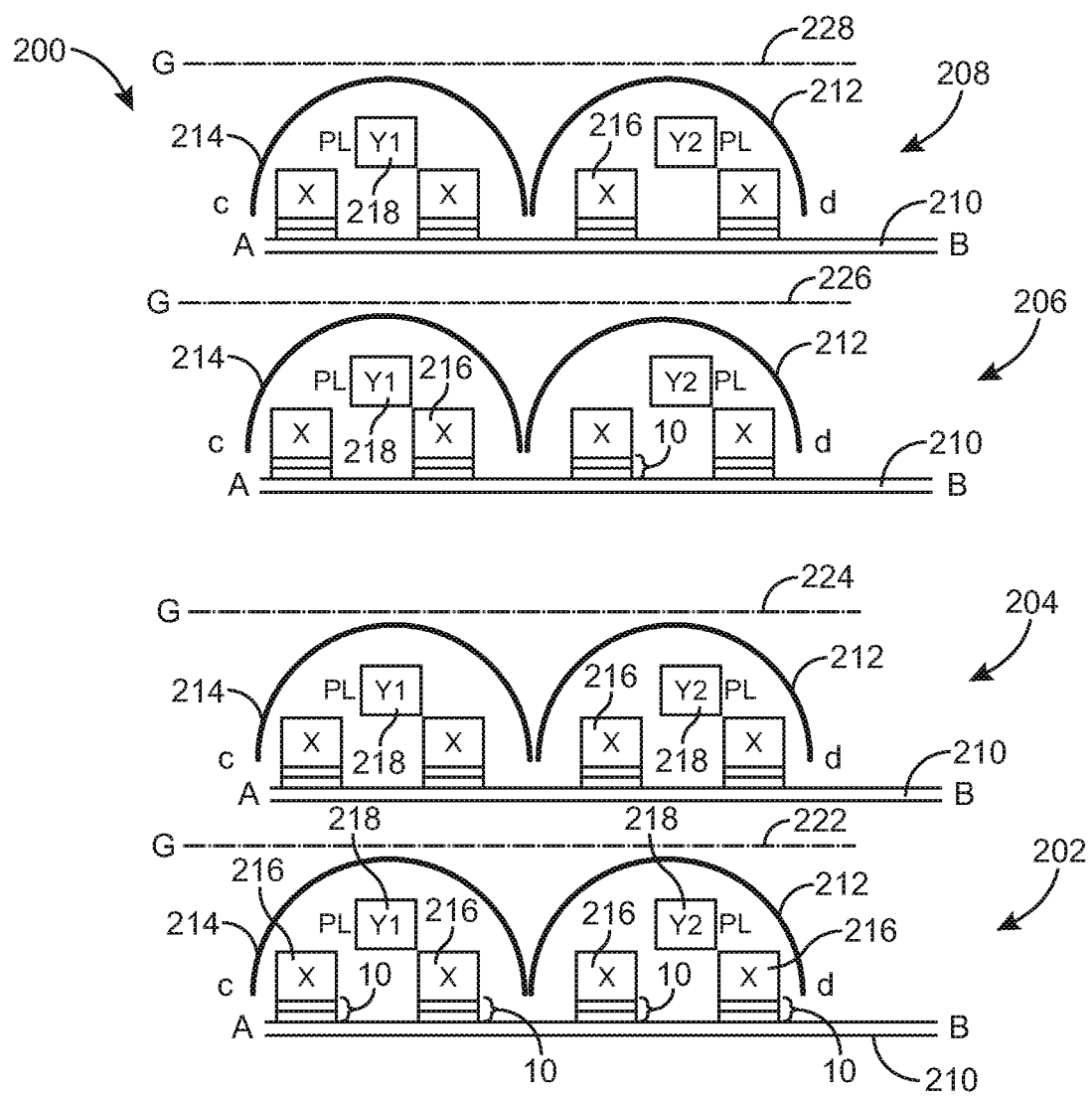
FIG. 9 shows a stacked memory structure 200 made of a number of memory elements 10 for the "storage" flash portion of the flash-RAM, in accordance with an embodiment of the present invention.

FIG. 9 shows a stacked memory structure 200 made of a number of memory elements 10, in accordance with an embodiment of the present invention. The structure 200 includes four stacks of memory elements—a stack 202, on top of which is shown formed the stack 204, on top of which is shown formed the stack 206, and on top of which is shown formed the stack 208. Each of the stacks 202-208 are shown to include four memory elements 10, and two magnetic-shield surfaces 212 and 214. The memory elements are shown formed on top of a word line 210 in each stack, and on top of each of the memory elements 10 is shown formed a bit line 216 (X). In between and above each pair of memory elements 10 is shown formed an erase line 218, so that there are two erase line 218*s* per stack, Y1 and Y2. Word lines, bit lines, and-erase lines are made of metal, and the bit lines 216 and the program lines 218 are formed going into the page.

Above each pair of memory elements' erase line 218 is formed a magnetic-shield layer 212 or 214, formed on top and around the erase line 218 and the memory elements 10. The magnetic shielded layers are CMPed down to levels 222, 224, 226 and 228, respectively, for stacks 202, 204, 206, and 208. The magnetic shielded layers are smoothed or flattened using a CMP process so that an adjacent stack may be formed there on top.

Figure 10:
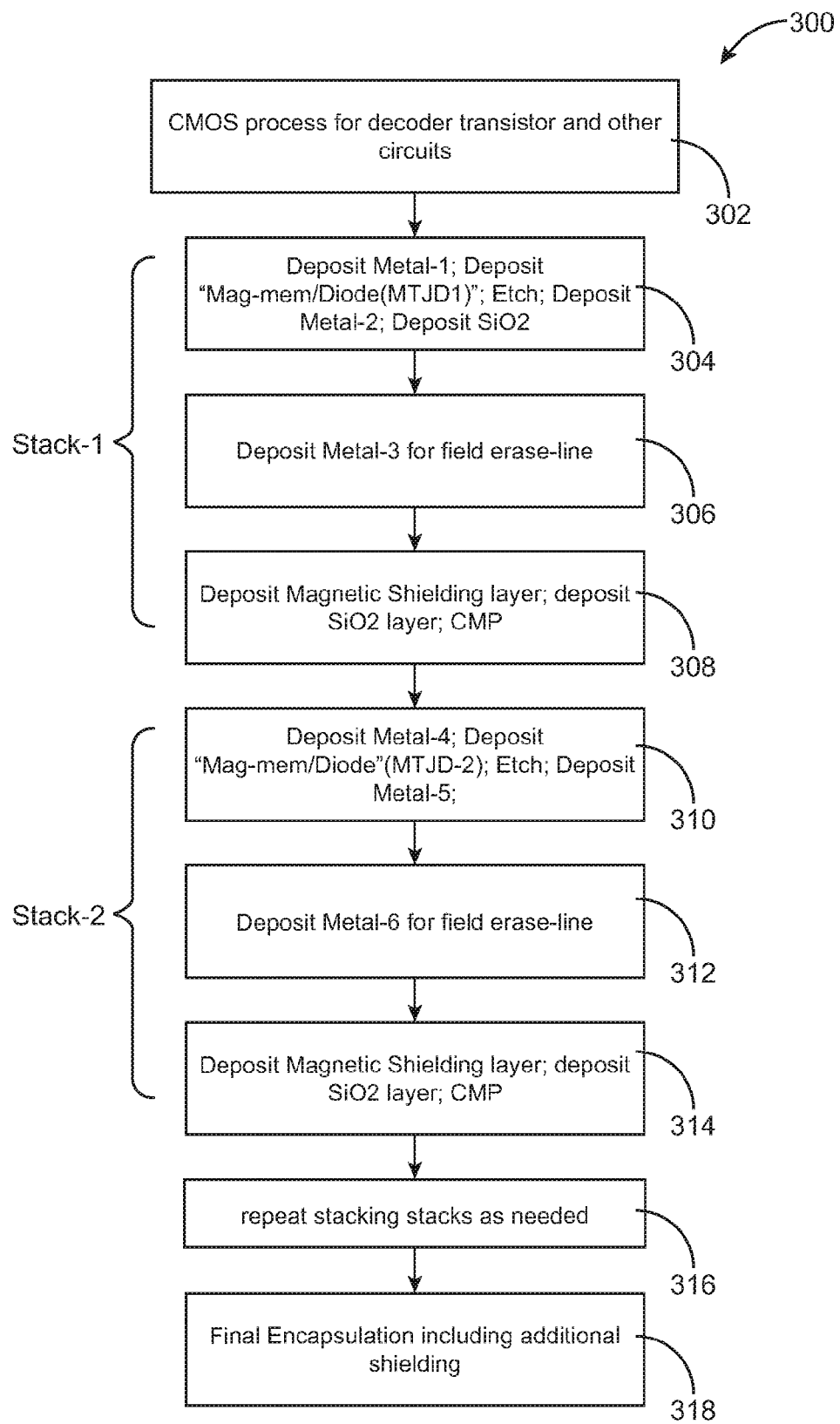
FIG. 10 shows a flow chart 300 of relevant steps performed in manufacturing a stack of memory elements, such as the stack 200 of FIG. 9.

FIG. 10 shows a flow chart 300 of relevant steps performed in manufacturing the stack of memory elements, such as the stack 200 of FIG. 9. In FIG. 10, at step 302, a CMOS process is performed to form the decoder transistor and other circuitry (collectively referred to as the "CMOS circuitry") used in conjunction with the stack of elements. Next, at step 304, a metal-1 layer is deposited on top of the CMOS circuitry, the MTJ and diode of the memory element 10 are deposited on top of the metal-1 and an etching process is performed, after which a metal-2 layer is deposited, followed by the deposition of a silicon dioxide (SiO2) layer.

Next, at step 306, a metal-3 layer is deposited, on top of the deposited SiO2 layer, forming a field erase or erase line, such as the lines 218, 220, 54, or others. Next, at step 308, a magnetic shielding layer is deposited on top of the deposited program line. The magnetic shielding layer is similar to the shielding layers 116, 136, 138, or the like. Also, at step 308, a SiO2 layer is deposited on top of the deposited magnetic shielding layer and CMP is performed. After the completion of the step 308 the first stack of memory elements is formed. Namely, steps 304-308 comprise the steps performed for manufacturing the first stack, such as the stack 202. Next, a second stack is formed on top of the first stack by performing the steps 310-314. Steps 310-314 are substantially identical to the stack-1 forming steps 304-308, except that steps 310-314 occur on top of already-formed stack-1.

At step 310, a metal-4 layer is deposited, and a second MTJ and diode combination, comprising a second memory element, is deposited on top of the metal-4 layer. An etching process is then performed, followed by deposition of a metal-5 layer.

Next, at step 312, a metal-6 layer is deposited on top of the metal-5 layer, forming a second program line. Thereafter, at step 314, a second magnetic shielding layer is deposited on top of the deposited metal-6 layer, and a second SiO2 layer is deposited and CMP is performed, thereby forming the second stack of memory elements. Next, at step 316, if additional stacks are needed they are formed sequentially, on top of the second stack, in accordance with the steps discussed relative to the formation of the first and second stacks. At step 318 and after the formation of all requisite stacks, an encapsulation process is performed to further shield the stack of elements.

Figure 11:
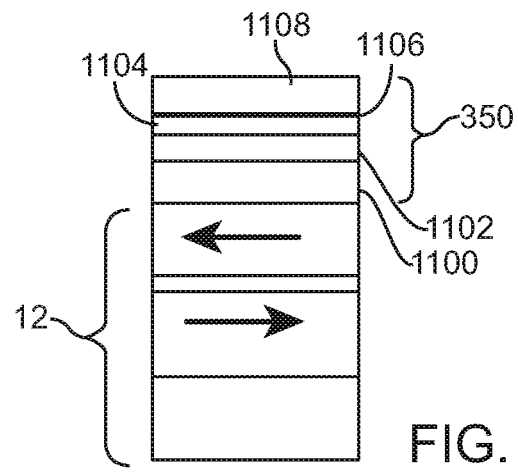
FIGS. 11 through 14 show different embodiments of the memory element 10.

FIGS. 11 through 14 show different embodiments of the memory element 10. FIG. 11 shows the MTJ 12 formed with a magnetic diode 350 on top thereof. The magnetic diode 350 is shown to include an isolation layer 1100, such as tantalum (Ta), on top of which is shown formed a silicon seeding layer 1102 for getting the primarily single crystalline Si layer thereon, one or more Si-doped layers 1104 shown formed on top of the layer 1102, and on top of the layer 1104 is shown formed a barrier tunneling layer 1106, on top of which is shown formed a metallic magnetic layer 1108.

Figure 12:
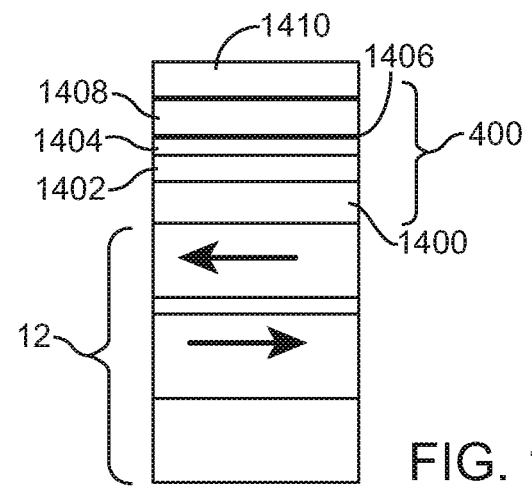

FIG. 12 shows the MTJ 12 formed with a non-magnetic diode 400 on top thereof. The non-magnetic diode 400 is shown to include an isolation layer 1400, in an exemplary embodiment made of Ta, a silicon (Si) seeding layer 1402 formed on top of isolation layer 1400 for getting the primarily single-crystalline Si layer thereon, one or more Si-doped layers 1404, 1406, and 1408, on top of which is shown formed a metallic non-magnetic layer 1410.

Figure 13:
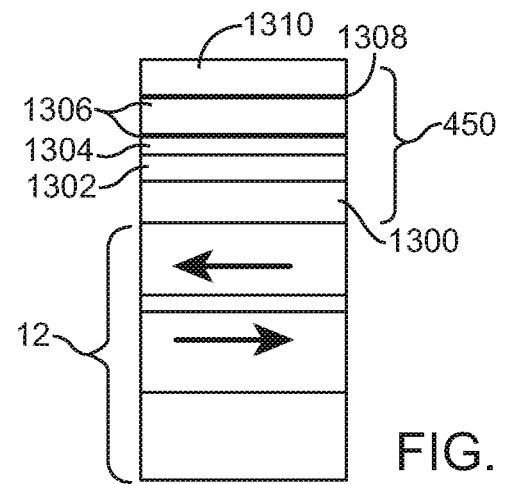

FIG. 13 shows the MTJ 12 formed with a magnetic diode 450 on top thereof. The thin film diode 450 is shown to include the layer isolation layer 1300, which in one embodiment is made of Ta, a Si-seeding layer 1302 formed on top of isolation layer 1300 for getting the primarily single-crystalline Si layer thereon, one or more Si-doped layers 1304-1308, and metallic non-magnetic layer 1310. This diode could be a Schottky diode having low breakdown voltage for reverse biasing. In such case the memory design would not require the erase line, or combination of the two could be used to erase the programmable stacked-memory.

Figure 14:
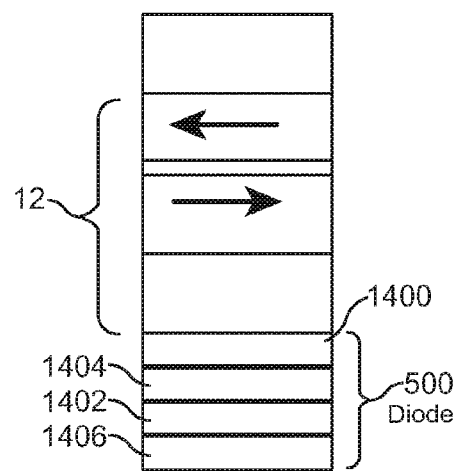

FIG. 14 shows a magnetic diode 500 with MTJ 12 formed with on top thereof. The magnetic diode 500 includes metallic non-magnetic layer 1406, on top of which is formed a Si-seeding layer 1402, on top of which is formed one or more Si-doped layers 1404, on top of which is formed an isolation layer 1400. The order of the formation of the layers may be altered, for example, to change the position of the free layer. This diode 500 may be a Schottky diode having low breakdown voltage for reverse biasing. In such a case, the memory element design would not require the erase line, or combination of the two could be used to erase the programmable stacked-memory.

FIG. 15 shows a stack of memory 550 including a first stack 568 on top of which is formed a second stack 560, which is separated from the first stack by a dielectric layer having a magnetic shielding layer embedded in the manners described earlier, which are smoothened by the CMP process to provide a smooth surface 562. The stack of memory 550 is shown formed on top of CMOS circuitry 552, which is shown to include row decoder transistors 554 and 556 and may include other CMOS circuitry. The stack of memory 550 is shown to include the metal layers and memory elements previously discussed relative to other figures. In FIG. 15, the process for manufacturing the stack of memory versus the CMOS circuitry is noteworthy.

The stack of memory 550 is manufactured using overall temperatures of less than 400 degrees Celsius while the CMOS circuitry 552 is manufactured using temperatures greater than 900 to 950 degrees Celsius. The lower temperature for manufacturing the stack of memory is important in that it allows the amorphous state of the diode to transform to a crystalline state, as noted with respect to FIG. 7. As mentioned earlier with respect to FIG. 7, a laser anneal process may be employed but such process involves heating a very thin layer of the film, typically less than 100 nm, and does not raise the temperature of the surrounding materials anywhere close to 400 degree C.

FIG. 16 shows a three dimensional perspective view of a memory structure 570 including an array of memory elements 572, multiple word line decoder transistors 574, and multiple bit line decoder transistors 576. The transistors 574 and 576 are CMOS circuitry, which are manufactured pursuant to the techniques shown and discussed relative to FIG. 15.

The memory elements 572 are each similar to memory element 10. The memory element transistors 576 are shown coupled to bit lines, with each of the transistors 576 being coupled to one bit; and the transistors 574 are shown coupled to the word lines, with each of the transistors 574 being coupled to a word line. Selection of a memory element 572 is made by activating a particular one of the transistors 576 and a particular one of the transistors 574, in a manner similar to previously-presented discussions regarding the same. The decoder for all stack layers is located in the silicon substrate. One bit of extra address causes the decoder to select another stack of memories.

FIG. 17 shows the memory structure 570 of FIG. 16 with the addition of an erase or program line 590, shown between two of the bit lines. During an erase operation, as the erase line 590 is activated, a magnetic field at 592 is generated, erasing the neighboring memory elements, and resetting the elements to have a parallel magnetic moment, or low-resistance state.

FIG. 18 shows a representation 600 of the behavior of the memory element 10 or 572 with respect to the word line 606 and the bit line 608, which form a memory cell. The memory element 610 is shown to be coupled to the word line 606 and the bit line 608. More specifically, the memory element 610 is shown to include a variable resistor 604 modeling the MTJ 12 of FIG. 1(b) and a diode 602, modeling the diode 40 of FIG. 1(b), coupled to one another. The diode 602, is also coupled to the word line 606, and the resistor 604 is shown also to be coupled to the bit line 608. In operation, current is applied, and passes through the forward, low-resistance direction, to cause writing of the memory cell to the anti-parallel direction. The memory cell starts out in the parallel state, which is the low resistance state. The reading is carried out by passing a low current, such as less than 50 micro-amps, in the forward direction of the diode. In contrast, the writing current could be as high as 500 micro-amps, depending on the structure of the MTJ as shown in FIG. 1(b). If the diode is a Schottky type diode, having low breakdown voltage in the reverse direction, then an opposite current of certain threshold can be applied to cause the erase operation instead of the erase line 590 in FIG. 18.

It should be noted that the objects of the drawings or figures discussed and presented herein are not necessarily drawn to scale. Additionally, the relative locations of the MTJ, as well as the layers of MTJs, such as the fixed and the free layers, can be adjusted based on the type of the diode and its characteristic in the forward and reverse direction.

Referring now to FIG. 19, flash- random-access-memory (RAM) 608 includes both non-volatile page-mode memory (sometimes referred to as "storage") and non-volatile RAM residing on one and the same monolithic die, in an alternative embodiment of the present invention. In the page-mode portion of the flash-RAM, data is read, written as well as erased a page at a time, and the size of the page is variable depending on the design choice. An example of a page size is 512 bits. In the non-volatile RAM (random-access-memory) portion, bits are read, written and erased one bit at a time. Flash-RAM 608 advantageously consumes less power than that of prior art hybrid memories and is less costly to manufacture. Yet, having non-volatile memory, a system made of the foregoing is allowed to use the same to boot, instantly turn on, and become operational; and utilizes system imaging (shadowing) for larger applications.

It should be noted that the term "flash," as used herein, refers to a large number of bits of memory which are accessed one-page-at-a-time and therefore better suited for larger bit storage, such as saving a large file. The size of this page depends on the basic memory cell design.

FIG. 19 shows the side view of a flash-RAM 608 including non-volatile random-access-memory (RAM) memory 610, non-volatile page-mode-memory (PMM) 612, and transistors 614, in accordance with an embodiment of the present invention. The non-volatile RAM memory 610 and non-volatile PMM 612 advantageously appear on the same monolithic die 613. This is achievable because of the separation of the transistors 614 into an isolated silicon area 616 that is shared by both non-volatile RAM memory 610 and non-volatile PMM 612, as described below.

In some embodiments of the present invention, the non-volatile PMM 612 is made of magnetic memory 614, including an array of magnetic memory elements formed on a stack 618. In some embodiments, more than one stack of magnetic memory elements comprise the non-volatile memory 612, with each stack being separated from the stacks below or above it by oxide with metal dispersed therein. It is understood, however, that oxide alone or other similar insulating material may be used to separate the stacks. Additionally, any number of stacks may be employed. The more stacks, the higher the capacity of the non-volatile memory part of the flash-RAM 608, and typically lower the cost.

In FIG. 19, bit lines/word lines 619 are shown connecting the non-volatile memories 612 and 610 to the transistors 614, which reside in the silicon 616 and are all deposited using a standard CMOS process. The lines 619 are made of metal (wire) and are conductive.

In some embodiments, the magnetic memory 614 includes an array of memory elements similar to the memory element 10 or any of the other memory elements of the various embodiments of the present invention. In other embodiments, the magnetic memory 614 includes memory elements shown and discussed in U.S. patent application Ser. No. 11/674,124, entitled "Non-Uniform Switching Based Non-Volatile Magnetic Based Memory," filed Feb. 12, 2007, by Ranjan, et al.; U.S. patent application Ser. No. 11/678,515, entitled "A High Capacity Low Cost Multi-State Magnetic Memory," filed Feb. 23, 2007, by Ranjan, et al.; and U.S. patent application Ser. No. 11/776,692, entitled "Non-Volatile Magnetic Memory Element with Graded Layer," filed Jul. 12, 2007, by Ranjan et al., all of which are incorporated herein by reference as though set forth in full.

In manufacturing the flash-RAM, some of the steps shown in FIG. 10 are performed. These steps include forming CMOS circuitry, depositing a first metal layer upon the CMOS circuitry, depositing a magnetic tunnel junction layer on top of the metal layer to form a non-volatile random-access-memory (RAM), depositing silicon oxide and silicon nitride on top of the non-volatile RAM, performing chemical mechanical polishing (CMP) on the deposited silicon oxide and silicon nitride thereby leaving a smooth surface of silicon oxide and silicon nitride, depositing a metal layer on top of the smooth surface, depositing a diode layer on top of the metal layer, and depositing magnetic tunnel junction (MTJ) on top of the diode layer. The method further includes etching the MTJ and the diode layer and depositing another layer of silicon oxide and silicon nitride and repeating the foregoing steps from the CMP on and the foregoing step of etching. Further, yet another layer of silicon oxide and silicon nitride is deposited and CMP is performed.

FIG. 20 shows further details of the stack of the non-volatile PMM 612 whose magnetic memory elements 624-630 appear in rows and columns, are coupled to word lines 640-644 (appearing as rows), and bit lines 646-650 (appearing as columns). It is understood that a stack of memory made of the non-volatile PMM 612 may include a different number of memory elements than those shown in FIG. 20. Each of the memory elements 624-630 is shown to include a MTJ and a thin-film diode. For example, the magnetic memory element 624 is shown to include a MTJ 620 and a diode 622, and the magnetic memory element 620 is shown to include a MTJ 632 and a diode 634. In one embodiment of the present invention, the diodes of the magnetic memory elements 624-630 are conventional diodes, and in another embodiment they are zener diodes. A zener diode advantageously allows selectively changing the direction of current through the MTJ under different bias-voltage conditions. This makes the flash-RAM design simpler, as the program/erase line 54 can be eliminated, thereby reducing the overall processing cost.

FIG. 21 shows the flash-RAM 608 with the silicon 616 shown to include decoders, which are typically made of transistors, such as the transistors 614. Three stacks 618 are shown, however a different number of stacks may be employed. It is important to note that because the decoders are built into the silicon 616, and the latter is separated from the stacks 618 (or non-volatile memory), both non-volatile RAM memory 610 and non-volatile PMM 612 may be formed on the same die, thereby reducing costs of manufacturing flash-RAM 608 when compared to prior art techniques, which require more than one die. Typically, a reduction in the number of die significantly affects manufacturing costs. Furthermore, power is reduced due to the use of only one monolithic die, as there is no need for additional I/Os and other excessive logic to transfer and hand-shake data between RAM memory and PMM memory.

FIG. 22 shows one of numerous applications of the flash-RAM 608. In FIG. 22, a computer system 652 is shown to include a host (or central processing unit (CPU)) 654 coupled to the flash-RAM 608, and is also coupled to input/output devices (not shown). Flash-RAM 608 takes the place of the NOR/NAND and DRAM of prior art, and provides non-volatile PMM memory, made of magnetic memory elements, that may be used for storage of large files such as an operating system file, and at the same time assisting other operations in the CPU 652. Generally, the lower part of the flash-RAM 608 is formed of non-volatile RAM memory 610, which functions generally as a non-volatile DRAM, and the non-volatile PMM 612 is deposited directly on top of the non-volatile DRAM memory. These are then stacked directly on top of each other with word and bit lines connected to transistors at the end. The memory cell size of the PMM element is typically $4F^2/N$, where N corresponds to the number of stacks. In contrast, the non-volatile RAM memory 610 has bit-by-bit access and has a typical cell size of $6-8F^2$. As shown below, as the number of stacks increases, the fractional percentage of non-volatile RAM memory cell size decreases proportionately. The proper ratios are to be determined based on the system designer's requirements, corresponding die size, and cost requirements.

In some embodiments, the flash-RAM 608 is used to store boot code, provide an instant-on system image of the hard disk drive, save data in case of a power-outage, and the like.

In some embodiments, the memory elements of the non-volatile PMM 618 comprise a one-time programmable memory, and in this respect they are similar to that shown and discussed relative to FIGS. 7 and 8 herein. The non-volatile RAM memory still operates in the same manner described earlier.

FIG. 23 shows two stacks 670 and 672 of non-volatile page (PMM) memory elements 10 (or flash-RAM 608), in accordance with an embodiment of the present invention. Each of the stacks 670 and 672 is analogous to the memory structure 50 of FIG. 4 herein. Additionally, transistors, e.g. transistors 614, which are formed for each of the stacks 670 and 672 are not shown, but are coupled to the bit lines 52 and the word lines 56, and reside on the silicon wafer 616 through metal stubs, such as the metal 619 (of FIG. 19), located at the end of the rows of memory elements. This allows for the separation of the transistors and the magnetic memory element stacks.

In FIG. 23, the transistors are selected through the word line 56. The magnetic memory part of the flash-RAM 608 has a structure described hereinabove. The stacks 670 and 672 are sequentially deposited. During the processing of stacks 670 and 672, masking and etching processes are used to obtain the above-mentioned shapes of the memory elements. These are then covered with the SiN or SiO2, or a combination thereof, to completely encapsulate the magnetic memory elements from any external environmental interactions. It is likely that one or more oxides or nitride layers having much higher density to protect the magnetic memory may be employed. The most preferred choice of such oxides or nitrides is any combinations of: ZrO2, Y2O3, Si3N4, TiN, and TaN. Additionally, a magnetic shielding layer, i.e., the magnetic shield 57 or 59, is inter-dispersed between these encapsulation layers to avoid any interference. The magnetic shields 57 and 59 are each made by having nano-particles of high magnetic permeability alloys dispersed in the "oxide" or "nitride" matrix. One of the best choices of the high magnetic permeability alloy for the magnetic shielding is the Conetic alloy comprising Ni—Fe—Cu—Mo. A thickness of 20-40 nm is sufficient to provide protection from any stray magnetic field.

The stacks 670 and 672 are identical in structure and function. As stated earlier, the number of stacks is denoted by "N", and this can be as many as 5 to 10 depending upon the available processing technology at the manufacturing site. Today, ten to twelve stacks are easily available in the high-volume low-cost manufacturing sites, which would enable as many as four to five stacks to be employed using low-cost process.

The lines 54, in FIG. 23, are program lines. It is understood that sometimes '54' are also referred to as the erase lines in various embodiments, as discussed above. The program lines 54 are introduced for rewriting the memory elements to their original states. A program line is generally used sparingly to rewrite a large number of bits at the same time, and is carried out by passing a higher level of current than that used for reading and writing of the bits. Each of the magnetic shields 57 or 59, once deposited, are then smoothened using a conventional CMP (chemical mechanical polishing) or an ECMP (electro chemical mechanical polishing) process using commercially available tools in the industry.

It should be noted that the stack 672 has memory elements similar to magnetic memory elements of the NVRAM part, and a magnetic diode (or diode 40), which is deposited directly on top of the MTJ of the same memory element. In one embodiment, the magnetic diode has the following layers: (Pt, Al, Ti)/Si/N-doped Si (and/or Si/P-doped Si). In one embodiment, the Pt layer is deposited on top of the MTJ element, which has the following structure: Ta/IrMn/CoFeB/Ru/CoFeB/MgO/CoFeB/(x/y/z)/Ta, i.e., on top of the top Ta layer. The x, y, z layers are used to reduce the switching current and may have any combinations of CoFe-alloy, CoFe-oxide, IrMn, and/or PtMn. In another embodiment, the (Pt, Al, Ti)/Si/N-doped Si/(and/or Si/P-doped Si)/Ta layers are deposited as the bottom of the magnetic memory element, which has the following structure: Ta/IrMn/CoFeB/Ru/CoFeB/MgO/CoFeB/(x/y/z)/Ta, i.e., on top of the top Ta layer. The x, y, z layers are used to reduce the switching current and may have any combinations of CoFe-alloy, CoFe-oxide, IrMn, and/or PtMn. It is likely that rather than using the conventional anti-ferromagnetic coupling alloys like the IrMn, PtMn or others, a combination of ferromagnetic-layers having a Ru layer in between can be used as an anti-ferromagnetic (AF) coupling layer. If the later is used, then the Ru layer thickness is very critical, and should be kept close to 0.7 nm, with a precise thickness tolerance less than 0.1 nm, to result in a strong AF coupling. It should be pointed out that the "quality" of the N-doped Si layer is very critical and should be substantially single crystalline rather than poly-crystalline silicon. A number of processing techniques may be employed to ensure that the N-doped Si-layer is substantially single crystalline, such as flash annealing or laser annealing. Additionally, seed layers may be employed to result in a better epitaxial growth of the Si layer, the sub-sequential layer P-doped Si, and/or N-doped Si layer, to ensure single-crystalline growth. Yet another approach involves modifying the plasma during the deposition of the N-doped Si layer. One such approach involves using H2 gas during the plasma deposition of the Si layer.

FIG. 24 shows connections of three stacks of memory elements to the bit line or word line, and to the CMOS transistors which are fabricated first on the substrate surface. 'A' represents the transistor 614, and 'B' represents the metal stubs 674, which are deposited sequentially as the subsequent top stacks are deposited. This avoids any need for deposition through deep vias in order to connect the stacks to the bottom CMOS transistors. Once the metal stubs B are stacked, metal lines, denoted as "c", are used to connect the stacks. It should be noted that the maximum deposition temperature is typically below 400 degrees C., thereby minimizing any likely diffusion between inter-stack layers, unlike the high density memory mentioned in references 6-8, where high temperatures over 800 degrees C. were used to deposit anti-fuse based one-time programmable memory.

Table 3 shows a comparison of the timing performance of the flash-RAM 608 with other hybrid-memory products currently available in the marketplace. While the read speed of most of the competing memory are almost same, the write speed of the flash-RAM memory 608 is almost ten times better. The erase time compares the time required to erase or rewrite (for flash-RAM) 16 kilobytes of memory. As can be seen, this time is again substantially lower than other hybrid-flash products. The program-erase time compares the time required for a large amount of old data (64 kilobytes, in this case) to be removed and rewritten with new data. The time required for such operation is also much lower for the flash-RAM memory 608. Other key attributes such as power and cost are also much lower for the flash-RAM memory 608. The endurance of flash-RAM 608 for multi read-write operations is typically greater than $10^{16}$, and is much higher than any other known flash-memory. At the same time, the high write/erase speed of the flash-RAM memory 608 makes it ideally suited for high I/O operations, such as servers requiring frequent read/write and erase operations. Table 3 represents exemplary characteristics for flash-RAM memory 608, and it is understood that other characteristics are also contemplated.

As earlier stated, the flash-RAM 608 may take the place of the memory elements 10 of FIGS. 7 and 8, in various embodiments of the present invention. Some such embodiments use a Zener diode as the diode 40. Such a diode is also a magnetic diode. The MTJ is deposited on top of the diode 40. The Zener diode is designed in such a way that the reverse breakdown voltage matches well with the "rewrite" current of the MTJ. The I-V (current-voltage) characteristics of a Zener diode are shown in FIG. 25. Zener diodes and their I-V characteristics are well known. One of the ways to achieve the foregoing is to ensure the right resistance for the MTJ, which is controlled through the thickness of its barrier (or MgO) layer. In one embodiment, the MTJ of the magnetic memory element has the following structure: Ta/IrMn/CoFeB/Ru/CoFeB/MgO/CoFeB/(x/y/z)/Ta, i.e., on top of the top Ta layer. The x, y, z layers are used to reduce the switching current and may have any combination of CoFe-alloy, CoFe-oxide, IrMn, PtMn. In another embodiment, the (Pt, Al, Ti)/Si/N-doped Si/(and/or Si/P-doped Si)/Ta layers are deposited in the bottom of the magnetic memory element, which has the following structure: Ta/IrMn/CoFeB/Ru/CoFeB/MgO/CoFeB/(x/y/z)/Ta, i.e., on top of the top Ta layer. The x, y, z layers are used to reduce the switching current and may have any combinations of CoFe-alloy, CoFe-oxide, IrMn, PtMn. It is likely that rather than using the conventional anti-ferromagnetic coupling alloys like the IrMn, PtMn or others, a combination of ferromagnetic layers having a Ru layer in between can be used as an AF-coupling layer. If the later is used then the Ru layer thickness is very critical and should be kept close to 0.7 nm, with a precise thickness tolerance of less than 0.1 nm, to result in a strong AF coupling.

In non-volatile RAM, the programming and erasing is done by changing the direction of current being applied thereto. In the non-volatile page-mode memory, if the Zener diode is used, programming and erasing is also done by changing the direction of current. If however, thin-film diode is used, an additional program line is employed and the magnetic field thereof is used for erasing in the non-volatile page-mode memory.

It is understood that the orders of MTJ 12 and the Zener diode 40 can be reversed. Each magnetic element 10 or a group of the memory elements 10 can be shielded (by the magnetic shields 57 or 59) from any likely magnetic interference from the neighboring memory elements, although this is less of a concern when the Zener diode is used. These shields are made during an encapsulation process, such as using SiN deposition, which is typically done using a chemical vapor deposition (CVD) or similar type of plasma processing. Another example is by RF- or DC-magnetron sputtering of composite targets comprising SiN, SiC, or SiO2, and containing over 60 vol % of high permeability magnetic material, such as the Conetic alloy, as described earlier.

In FIGS. 7 and 8, "ef" refers to the subsequent deposition of the encapsulation layers, which can be SiO2, SiC, and/or SiN, using a high deposition plasma process, such as chemical-vapor deposition (CVD), or RF- or DC-magnetron sputtering. Once the surface "ef" is polished, using preferably a CMP process, the surface becomes smooth like "GH" and is ready for the next stack layer processing. It is likely that one or more oxides or nitride layers having much higher density to protect the "magnetic" memory may be employed. The most preferred choice of such oxides or nitrides would be any combination of: ZrO2, Y2O3, Si3N4.

In alternative embodiments, use of the Zener diode can also be applied to other non-volatile memories such as the phase-change memory, resistive memory and ferro-electric memory.

Alternatively, a simpler design of flash-RAM can be used for other applications, such as one-time programmable or WORM (write-once-read-many), by substituting the memory elements 10 of the stack layers 670 and 672 of flash-RAM 608, with those of the FIGS. 7 and 8. In the most preferred mode, such memory may not require any magnetic shielding, thereby resulting in a lower cost. If the magnetic shielding is preferred, the magnetic shields made during encapsulation process, such as using SiN deposition, which is typically done using a chemical vapor deposition (CVD), or similar type of plasma processing. Another example is by RF- or DC-magnetron sputtering of composite targets comprising SiN, SiC, or SiO2, and containing over 60 vol % of high permeability magnetic material, such as the Conetic alloy, as described earlier.

Applications of the flash-RAM, other than those already mentioned include but are not limited to the military or high security applications where it is desirable to completely destroy the data in order to avoid any undesired access to the stored contents. Other data storage devices, such as hard-disk drives, tape drives, or other solid-state drives take much longer to destroy the data and the process is very cumbersome.

In accordance with various embodiments of the present invention, an array of magnetic memory is made of one or more stacks of magnetic memory elements. The magnetic memory elements include at least one MTJ and a thin film diode, which are sequentially deposited during manufacturing, preferably in the same sputter cluster tool. These elements are arranged in a cross-line architecture, with each individual bit line and word line having a separate transistor, which are deposited using a standard CMOS (transistor) process. Each cross-line may also consist of program lines, which are required for bulk erasing or resetting the rewritable non-volatile memory. The program line is eliminated for one time programmable memory. A number of such memory stacks, for example five to ten stacks, can be deposited on top of each other leading to a three-dimensional stacked memory structure having extremely small cell size foot print. The array advantageously has the following attributes: high capacity, low cost, fast switching, non-volatile, and rugged, with fast access times. This type of memory also requires a low switching current, thereby leading to an overall lower power requirement during any integrated application.

Although the present invention has been described in terms of specific embodiments, it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A flash-RAM memory capable of storing data that is read or written using transistors comprising:

a plurality of transistors, residing in an isolated silicon area of a monolithic die;

non-volatile random access memory (RAM) including an array of magnetic memory cells, the non-volatile RAM formed on the monolithic die and including magnetic memory cells; and a non-volatile page-mode memory formed on top of the non-volatile RAM, the non-volatile page-mode memory being made of non-magnetic memory, the non-volatile page-mode memory and the non-volatile RAM residing on the monolithic die, the non-volatile page-mode memory being operable to store data for reading, the non-volatile page-mode memory and the non-volatile RAM being coupled to the plurality of transistors through bit lines or word lines and the plurality of transistors being shared by the non-volatile RAM and the non-volatile page-mode memory, at least one magnetic memory cell of the flash-RAM being accessed by a single transistor of the plurality of transistors and at least one page of the non-volatile page-mode memory being accessed by a single transistor of the plurality of transistors, wherein data is read, written and erased a page at a time to the non-volatile page-mode memory, with a page comprising a plurality of bits, whereas, the non-volatile RAM is written to and read from one bit at a time, further wherein the non-volatile RAM is organized into at least two stacks of magnetic memory cells.

2. A flash-RAM memory, as recited in claim 1 wherein each stack is separated from another stack by an oxide layer and each of the magnetic memory cells of the non-volatile RAM include a magnetic tunnel junction (MTJ) made of a pinning layer on top of which is formed a fixed layer, on top of which is formed a tunnel layer, on top of which is formed a free layer.

3. A flash-RAM memory, as recited in claim 1 wherein each stack is separated from another stack by a dielectric layer and each of the magnetic memory cells of the non-volatile RAM include a magnetic tunnel junction (MTJ) made of a pinning layer on top of which is formed a fixed layer, on top of which is formed a tunnel layer, on top of which is formed a free layer.

4. A flash-RAM memory, as recited in claim 1, wherein the page size variable.

5. A flash-RAM memory, as recited in claim 1, wherein the page size is 512 bits.

6. A flash-RAM memory, as recited in claim 1, wherein the non-volatile RAM is read one bit at a time and written to one bit at a time.

7. A flash-RAM memory, as recited in claim 1, wherein a magnetic shielding layer is formed on top of the MTJ.

8. A flash-RAM memory, as recited in claim 7, wherein the magnetic shielding layer is made of nano-particles of high magnetic permeability alloys dispersed in a oxide or nitride matrix.

9. A flash-RAM memory, as recited in claim 7, wherein the magnetic shielding layer is made of Conetic alloy comprising Ni, Fe, Cu, or Mo.

10. A flash-RAM memory, as recited in claim 7, wherein the magnetic shielding layer has a thickness of 20 to 40 nano meters.

11. A flash-RAM memory, as recited in claim 7, wherein the magnetic shielding layer has a thickness that is sufficient to provide protection from stray magnetic field.

12. The flash-RAM memory, as recited in claim 1, further including a plurality of bit lines, a bit line of the plurality of bit lines connecting one of the magnetic memory cells of the non-volatile RAM to one of the plurality of transistors.

13. The flash-RAM memory, as recited in claim 1, further including a plurality of word lines, a word line of the plurality of word lines connecting one of the magnetic memory cells of the non-volatile RAM to one of the plurality of transistors.

14. The flash-RAM memory, as recited in claim 1, wherein at least one of the magnetic memory cells includes a magnetic diode.

15. The flash-RAM memory, as recited in claim 14, wherein the magnetic diode is made of three layers, a first layer, a second layer, and a third layer.

16. The flash-RAM memory, as recited in claim 15, wherein the first layer of the magnetic diode is made of Pt, Al, or Ti.

17. The flash-RAM memory, as recited in claim 15, wherein the second layer of the magnetic diode is made of Si.

18. The flash-RAM memory, as recited in claim 17, wherein the third layer of the magnetic diode is made of N-doped Si or P-doped Si.

19. The flash-RAM memory, as recited in claim 18, wherein the third layer of the magnetic diode is made of N-doped Si having a single crystalline structure.

20. The flash-RAM memory, as recited in claim 18, wherein the first layer of the magnetic diode is deposited on top of the MTJ.

21. The flash-RAM memory, as recited in claim 1, wherein at least one of the memory cells includes a zener diode that has a reverse breakdown voltage that matches a rewrite current used to program the MTJ.

22. The flash-RAM memory, as recited in claim 1, wherein at least one of the memory cells includes a thin-film diode.

23. The flash-RAM memory, as recited in claim 1, wherein the non-volatile RAM is configured to be programmed and erased by changing the direction of current being applied thereto.

24. The flash-RAM memory, as recited in claim 1, wherein the non-volatile RAM has a three-dimensional stacked memory structure.

25. The flash-RAM memory, as recited in claim 1, wherein the free layer of the MTJ of the magnetic memory cells has in-plane magnetic moments.

26. The flash-RAM memory, as recited in claim 1, wherein the free layer of the MTJ of the magnetic memory cells has perpendicular magnetic moments.

27. The flash-RAM memory, as recited in claim 1, wherein the magnetic memory cells are coupled to bit lines or word lines by metal stubs, a metal stub formed on top of a transistor of the plurality of transistors on top of which is formed one of the at least two stacks with the metal stubs used to connect the transistor to the stack.

28. A computer system comprising:
a host; and
flash-RAM coupled to the host configured to store data, the flash-RAM including,
  a plurality of transistors, residing in an isolated silicon area of a monolithic die,
  non-volatile random access memory (RAM) including an array of magnetic memory cells, the non-volatile RAM formed on the monolithic die and including magnetic memory cells,
  a non-volatile page-mode memory formed on top of the non-volatile RAM, the non-volatile page-mode memory being made of non-magnetic memory, the non-volatile page-mode memory and the non-volatile RAM residing on the monolithic die, the non-volatile page-mode memory being operable to store data for reading, the non-volatile page-mode memory and the non-volatile RAM being coupled to the plurality of transistors through bit lines or word lines and the plurality of transistors being shared by the non-volatile RAM and the non-volatile page-mode memory, at least one magnetic memory cell of the flash-RAM being accessed by a single transistor of the plurality of transistors and at least one page of the non-volatile page-mode memory being accessed by a single transistor of the plurality of transistors,
wherein data is read, written and erased a page at a time to the non-volatile page-mode memory, with a page comprising a plurality of bits, whereas, the non-volatile RAM is written to and read from one bit at a time, further wherein at least one of the memory cells includes a diode.

29. A computer system as recited in claim 28, wherein at least one of the memory cells includes a zener diode.

30. A computer system as recited in claim 28, wherein at least one of the memory cells includes a Schottky diode.

31. A computer system as recited in claim 28, wherein the flash-RAM is used to store boot code.

32. A computer system as recited in claim 28, wherein the flash-RAM is used to provide an instant-on system image of the hard disk drive., save data in case of a power-outage, and the like.

33. A computer system as recited in claim 28, wherein the flash-RAM is used to save data in case of a power-outage.

34. A computer system as recited in claim 28, wherein the memory elements comprise a one-time programmable memory.

35. A computer system as recited in claim 28, wherein the free layer of the MTJ of the magnetic memory cells has in-plane magnetic moments.

36. A computer system as recited in claim 28, wherein the free layer of the MTJ of the magnetic memory cells has perpendicular magnetic moments.

37. A computer system as recited in claim 28, wherein the flash-RAM memory is configured to have all of the data stored therein destroyed thereby preventing access to the data.

* * * * *